(12) United States Patent
Heo et al.

(10) Patent No.: US 12,355,004 B2
(45) Date of Patent: Jul. 8, 2025

(54) SEMICONDUCTOR CHIP AND SEMICONDUCTOR PACKAGE

(71) Applicant: Samsung Electronics Co., Ltd., Suwon-si (KR)

(72) Inventors: Junyeong Heo, Suwon-si (KR); Yeongkwon Ko, Hwaseong-si (KR); Unbyoung Kang, Hwaseong-si (KR); Teakhoon Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 629 days.

(21) Appl. No.: 17/667,989

(22) Filed: Feb. 9, 2022

(65) Prior Publication Data

US 2022/0399311 A1 Dec. 15, 2022

(30) Foreign Application Priority Data

Jun. 11, 2021 (KR) .................. 10-2021-0076236

(51) Int. Cl.
*H01L 25/065* (2023.01)
*H01L 21/78* (2006.01)
*H01L 23/00* (2006.01)

(52) U.S. Cl.
CPC .......... *H01L 25/0657* (2013.01); *H01L 21/78* (2013.01); *H01L 24/32* (2013.01);
(Continued)

(58) Field of Classification Search
CPC . H01L 25/043; H01L 25/0657; H01L 25/074; H01L 25/0756; H01L 25/117;
(Continued)

(56) References Cited

U.S. PATENT DOCUMENTS 7,544,588 B2 6/2009 Genda
7,759,223 B2 7/2010 Kida et al.
(Continued)

FOREIGN PATENT DOCUMENTS

JP 2013-197108 A 9/2013
JP 6423135 B2 11/2018
(Continued)

*Primary Examiner* — Julio J Maldonado
*Assistant Examiner* — Stanetta D Isaac
(74) *Attorney, Agent, or Firm* — MORGAN, LEWIS & BOCKIUS LLP

(57) ABSTRACT

A semiconductor package includes a first semiconductor chip, a plurality of second semiconductor chips sequentially stacked on the first semiconductor chip, and an insulating adhesive layer between the first semiconductor chip, and each of the plurality of second semiconductor chips, each of the plurality second conductor chips, and the insulating adhesive layer including an adhesive fillet protruding from between at least the first semiconductor chip and each of the plurality of second semiconductor chips, wherein a grooving recess is defined by the first semiconductor chip, the plurality of second semiconductor chips, and the insulating adhesive layer, the grooving recess including a first recess and a second recess adjacent to the first recess, an uppermost surface of the adhesive fillet and the first semiconductor chip defines the first recess, and an uppermost surface of the first semiconductor chip to a surface inside the first semiconductor chip defines the second recess.

20 Claims, 33 Drawing Sheets

(52) U.S. Cl.
CPC .... *H01L 24/33* (2013.01); *H01L 2224/32145* (2013.01); *H01L 2224/33181* (2013.01); *H01L 2225/06555* (2013.01)

(58) Field of Classification Search
CPC ..... H01L 2225/06503–06596; H01L 23/3128; H01L 23/3135; H01L 23/10; H01L 23/3142; H01L 23/3185; H01L 21/561; H01L 21/563; H01L 21/76
See application file for complete search history.

(56) References Cited

U.S. PATENT DOCUMENTS

| | | |
|---|---|---|
| 7,829,439 B2 | 11/2010 | Kida |
| 7,897,488 B2 | 3/2011 | Watanabe et al. |
| 7,906,410 B2 | 3/2011 | Arita et al. |
| 8,759,197 B2 | 6/2014 | Holden |
| 10,796,962 B2 | 10/2020 | Wakahara et al. |
| 2007/0111477 A1 | 5/2007 | Maruyama et al. |
| 2020/0020641 A1* | 1/2020 | Ko ................... H01L 25/0657 |

FOREIGN PATENT DOCUMENTS

| | | | |
|---|---|---|---|
| JP | 2020-021786 A | 2/2020 | |
| JP | 6770858 B2 | 10/2020 | |

* cited by examiner

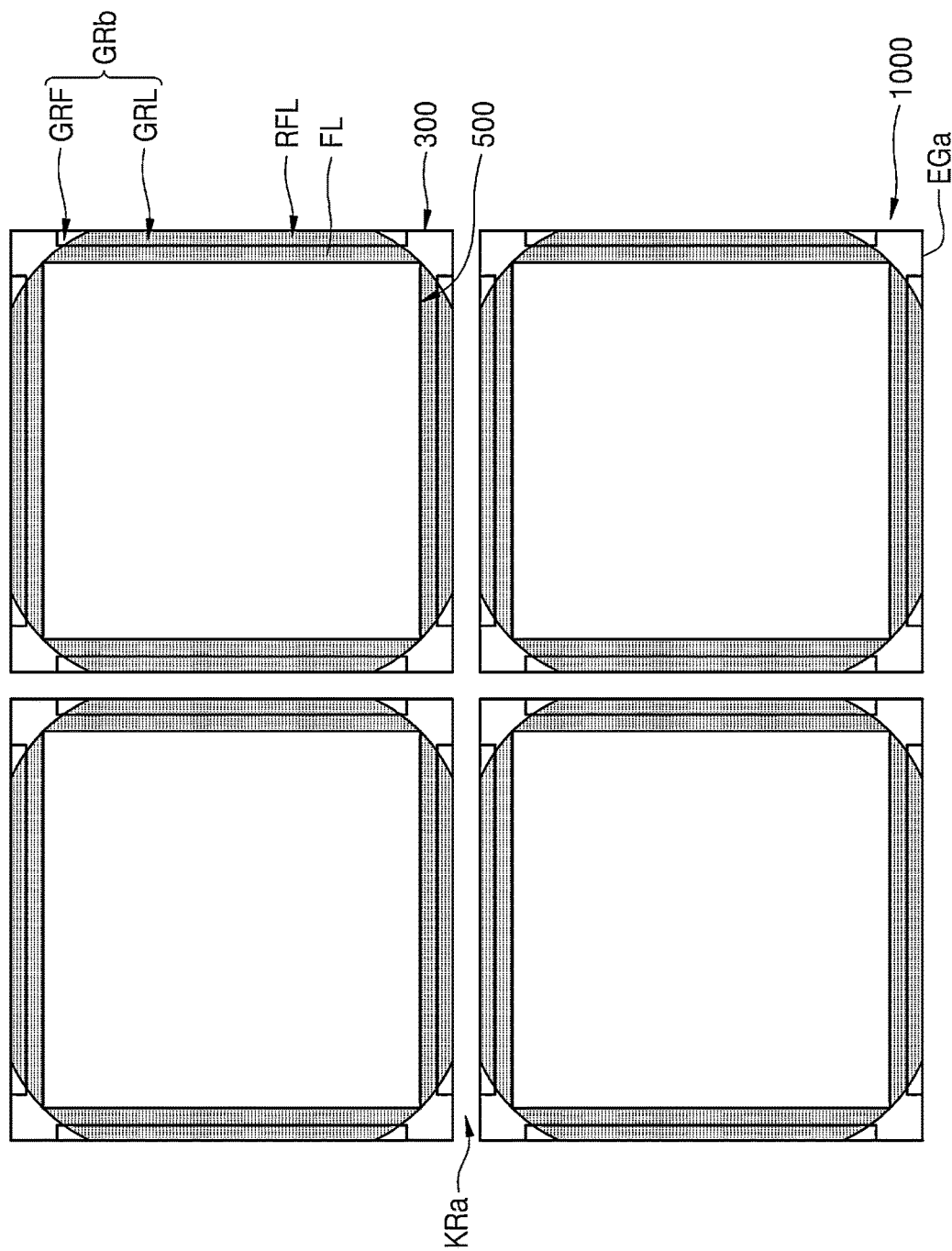

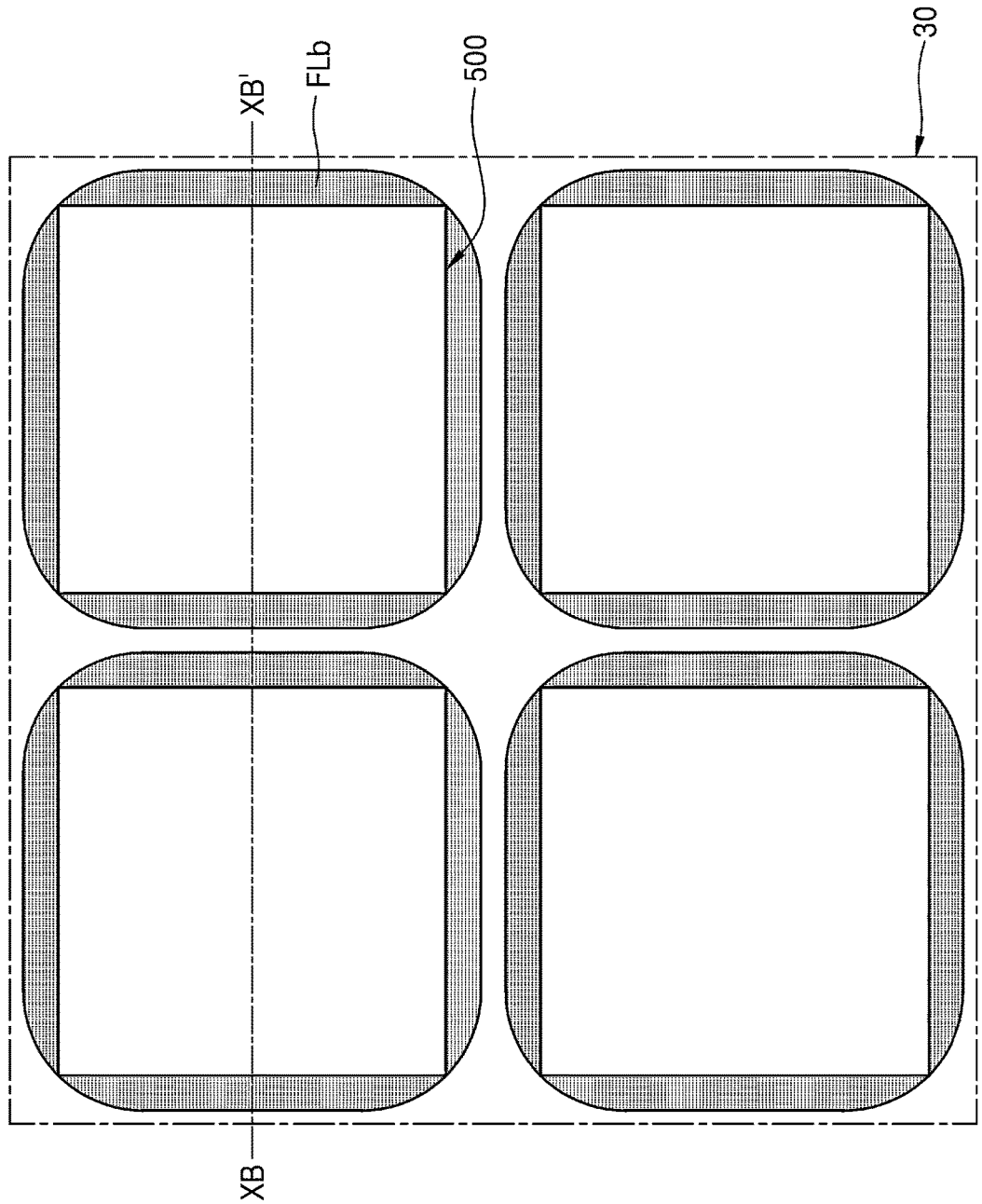

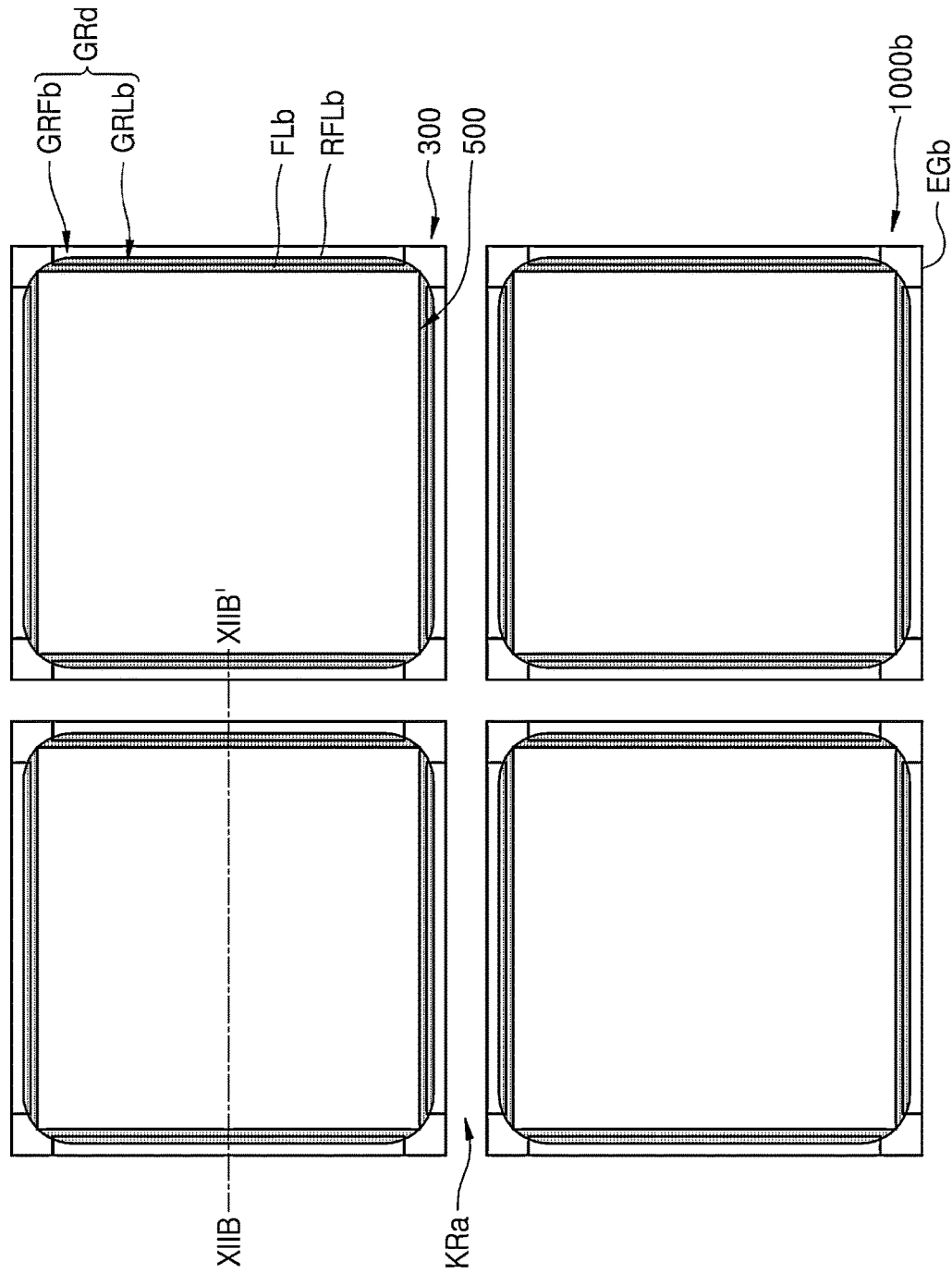

SEMICONDUCTOR CHIP AND SEMICONDUCTOR PACKAGE

CROSS-REFERENCE TO RELATED APPLICATION

This application is based on and claims priority under 35 U. S. C. § 119 to Korean Patent Application No. 10-2021-0076236, filed on Jun. 11, 2021, in the Korean Intellectual Property Office, the disclosure of which is incorporated by reference herein in its entirety.

BACKGROUND

The inventive concepts relate to a semiconductor chip and a semiconductor package, and more particularly, to a singulated semiconductor chip and a singulated semiconductor package.

After a plurality of semiconductor chips are formed on a semiconductor substrate (such as a wafer), a singulation process is performed so that the plurality of semiconductor chips are separated from one another.

For example, in order to improve productivity in accordance with the breakthrough of the electronics industry, after a plurality of semiconductor packages, including the plurality of semiconductor chips, are formed together (e.g., by using a semiconductor substrate such as a wafer or attached onto a support substrate), the plurality of semiconductor packages undergo a singulation process.

SUMMARY

The inventive concepts relate to a singulated semiconductor chip and a singulated semiconductor package with reliability.

In order to achieve the above object, according to the inventive concept, the following semiconductor package is provided.

According to an aspect of the inventive concepts, there is provided a semiconductor package including a first semiconductor chip, a plurality of second semiconductor chips sequentially stacked on the first semiconductor chip, and an insulating adhesive layer between the first semiconductor chip, and each of the plurality of second semiconductor chips, each of the plurality second conductor chips, and the insulating adhesive layer including an adhesive fillet protruding from a space between at least the first semiconductor chip and each of the plurality of second semiconductor chips outward, wherein the first semiconductor chip, the plurality of second semiconductor chips, and the insulating adhesive layer are arranged as to define a grooving recess in the semiconductor package, the grooving recess including a first recess and a second recess adjacent to the first recess, and wherein an uppermost surface of the adhesive fillet and the first semiconductor chip defines the first recess, and an uppermost surface of the first semiconductor chip to a surface inside the first semiconductor chip defines the second recess.

According to an aspect of the inventive concepts, there is provided a semiconductor package including a first semiconductor chip, a plurality of second semiconductor chips sequentially stacked on the first semiconductor chip and each having a horizontal width less than that of the first semiconductor chip, an insulating adhesive layer between the first semiconductor chip, the plurality of second semiconductor chips, and each of the plurality of second semiconductor chips, and the insulating adhesive layer including having an adhesive fillet protruding from a space between at least the first semiconductor chip and each of the plurality of second semiconductor chips outward and covering at least a part of a side surface of each of the plurality of second semiconductor chips and at least a part of an upper surface of the first semiconductor chip, and a molding layer surrounding the plurality of second semiconductor chips and the insulating adhesive layer on the first semiconductor chip, wherein the first semiconductor chip, the plurality of second semiconductor chips, and the insulating adhesive layer are arranged as to define a grooving recess contacting an edge of the first semiconductor chip, and extending along the edge of the first semiconductor chip, the grooving recess including a first recess and a second recess adjacent to the first recess, and wherein an uppermost surface of the adhesive fillet and the first semiconductor chip defines the first recess, and an uppermost surface of the first semiconductor chip and a surface inside the first semiconductor chip defines the second recess.

According to an aspect of the inventive concepts, there is provided a semiconductor package including a first semiconductor chip including a first substrate, a first semiconductor device on the first substrate, and a plurality of first through electrodes passing through at least a part of the first substrate, at least one second semiconductor chip stacked on the first semiconductor chip and having a horizontal width less than that of the first semiconductor chip, the at least one second semiconductor chip including a second substrate, a second semiconductor device on the second substrate, and a plurality of second through electrodes passing through at least a part of the second substrate and electrically connected to the plurality of first through electrodes, an insulating adhesive layer between the first semiconductor chip and the at least one second semiconductor chip, the insulating adhesive layer including and having an adhesive fillet protruding from a space between the first semiconductor chip and the at least one second semiconductor chip outward and covering at least a part of a side surface of the at least one second semiconductor chip and at least a part of an upper surface of the first semiconductor chip, and a molding layer surrounding the at least one second semiconductor chip and the insulating adhesive layer on the first semiconductor chip, wherein the first semiconductor chip, the plurality of second semiconductor chips, and the insulating adhesive layer are arranged as to define four grooving recesses extending along four edges of the first semiconductor chip with a constant horizontal width, and filled with the molding layer, each of the four grooving recesses including a first recess and a second recess adjacent to the first recess, wherein an uppermost surface of the adhesive fillet and the first semiconductor chip defines the first recess, and an uppermost surface of the first semiconductor chip and a surface inside of the first semiconductor chip defines the second recess, and wherein and the second recess having has a lower surface at a vertical level lower than that of a lower surface of the first recess.

BRIEF DESCRIPTION OF THE DRAWINGS

Example embodiments of the inventive concepts will be more clearly understood from the following detailed description taken in conjunction with the accompanying drawings in which:

FIGS. 6A to 8 are plan layout diagrams and cross-sectional views illustrating a method of manufacturing a semiconductor package according to some example embodiments;

FIGS. 10A to 12B are plan layout diagrams and cross-sectional views illustrating a method of manufacturing a semiconductor package according to some example embodiments and a semiconductor package manufactured by the method;

DETAILED DESCRIPTION OF THE EMBODIMENTS

Figure 1A:
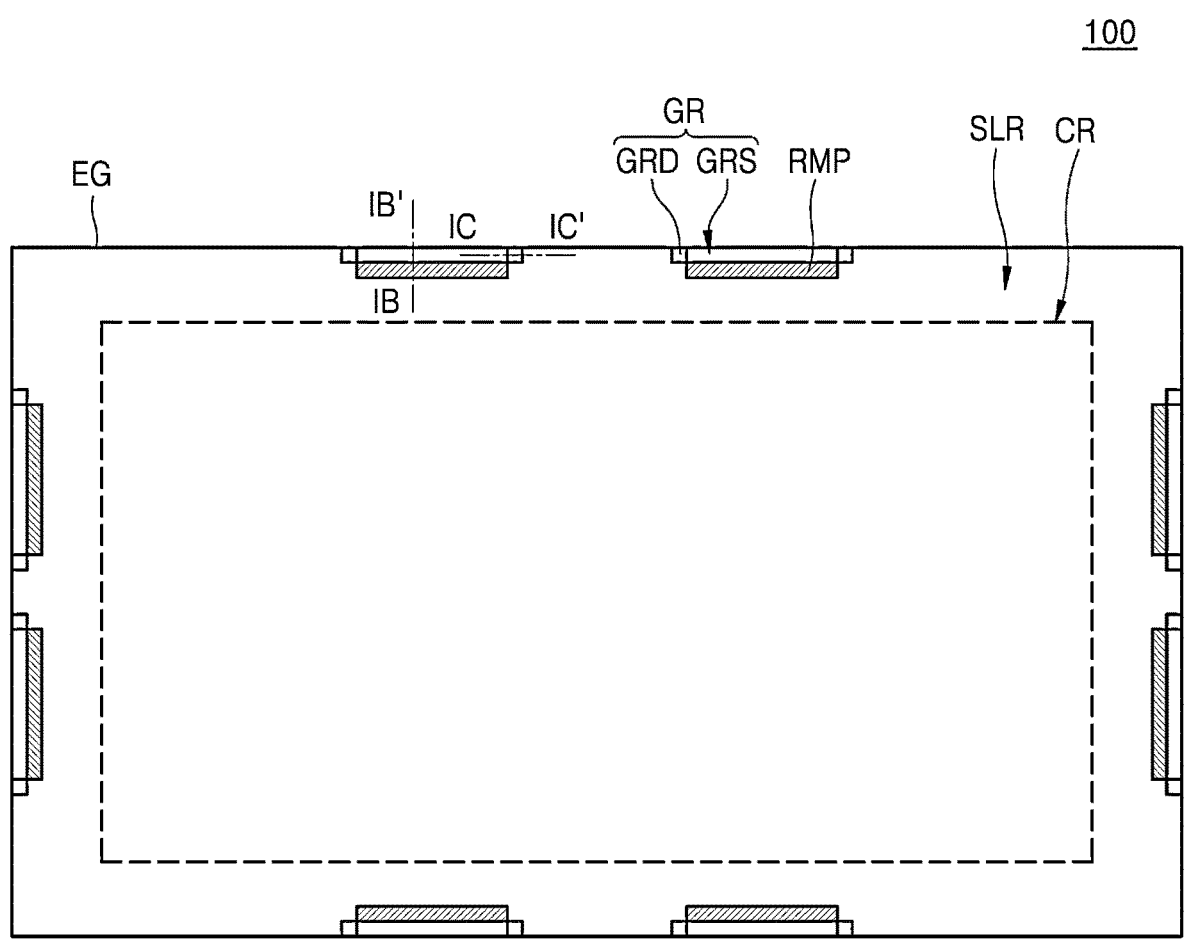
FIG. 1A is a plan layout diagram of a semiconductor chip according to some example embodiments and FIGS. 1B and 1C are cross-sectional views of the semiconductor chip of FIG. 1A.

Hereinafter, example embodiments will be described in detail with reference to the accompanying drawings, wherein like reference numerals refer to like elements throughout.

When the terms "about" or "substantially" are used in this specification in connection with a numerical value, it is intended that the associated numerical value includes a manufacturing tolerance (e.g., ±10%) around the stated numerical value. Further, regardless of whether numerical values or shapes are modified as "about" or "substantially," it will be understood that these values and shapes should be construed as including a manufacturing or operational tolerance (e.g., ±10%) around the stated numerical values or shapes.

Spatially relative terms such as "vertical" may be used herein for ease of description to describe one element's relationship to another element, e.g., as shown in the figures. Such spatially relative terms are intended to encompass different orientations of the device in use or operation in addition to the orientation depicted in the figures. For example, the device may also be oriented in other ways (for example, turned over, and/or rotated 90 degrees and/or at other orientations), and the spatially relative terms used herein are to be interpreted accordingly.

Figure 1B:
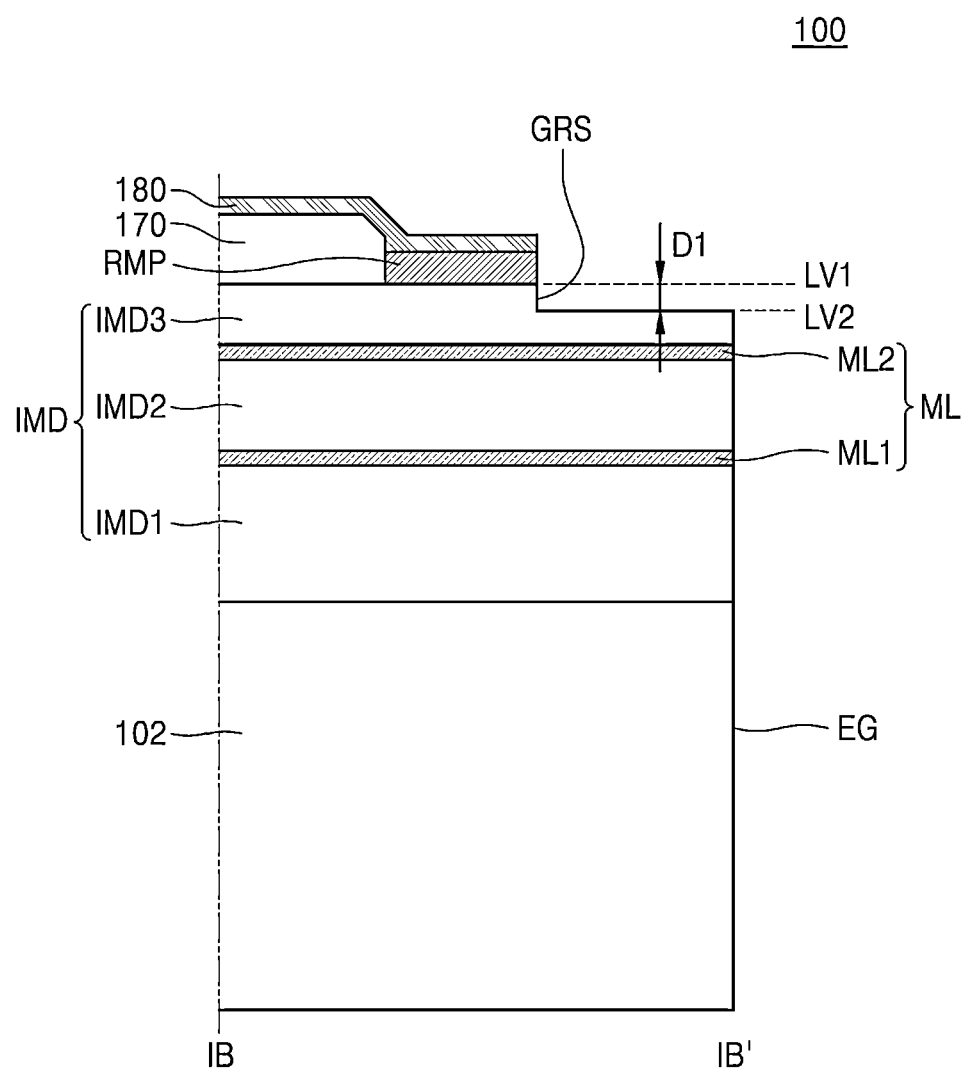
Figure 1C:
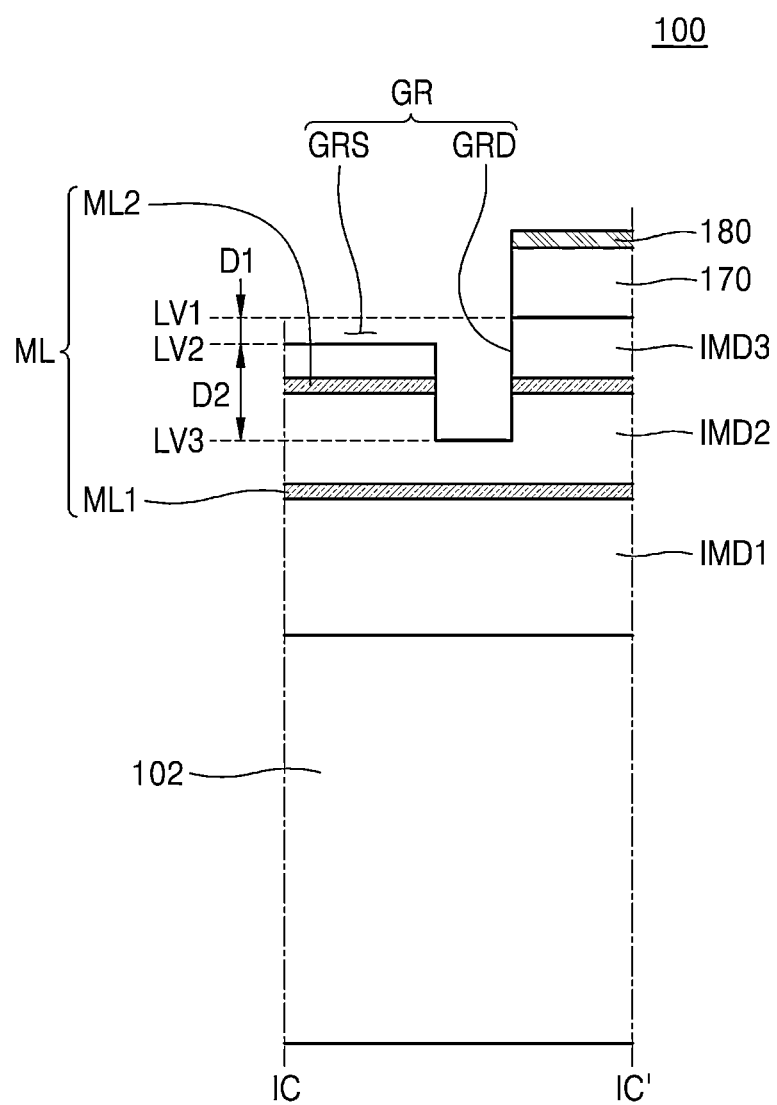

FIG. 1A is a plan layout diagram of a semiconductor chip 100 according to embodiments of the inventive concept, and FIGS. 1B and 1C are cross-sectional views of a semiconductor chip 100. Specifically, FIGS. 1B and 1C are cross-sectional views taken along lines IB-IB' and IC-IC' of FIG. 1A.

Referring to FIGS. 1A to 1C, the semiconductor chip 100 includes a substrate 102 having a device region CR and a scribe lane region SLR, an inter-wire insulating layer IMD and a wiring layer ML provided on the substrate 102, and a residual metal pattern RMP provided on the inter-wire insulating layer IMD. The scribe lane region SLR may reside in a scribe lane (e.g., in the semiconductor chip 100) formed on a semiconductor substrate (e.g., a wafer) and may be arranged along an edge EG of the semiconductor chip 100 to surround the device region CR. The edge EG of the semiconductor chip 100 may correspond to a kerf region KR formed along the scribe lane region SLR, for example, as illustrated in FIG. 2C.

The semiconductor chip 100 may include a processor and/or memory. For example, the semiconductor chip 100 may include a central processing unit (CPU) chip, a graphics processing unit (GPU) chip, an application processor (AP) chip, and/or the like. The semiconductor chip 100 may include, for example, a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, a resistive random access memory (RRAM) chip, and/or the like.

In some example embodiments, the substrate 102 may include an elemental semiconductor such as silicon (Si) and/or germanium (Ge), and/or a compound semiconductor such as silicon carbide (SiC), gallium arsenide (GaAs), indium arsenide (InAs), indium phosphide (InP), and/or the like. The substrate 102 may include an active surface and an inactive surface opposite to the active surface. A semiconductor device including a plurality of various kinds of individual devices may be formed on the active surface of the substrate 102. The plurality of individual devices may include various microelectronic devices, for example, a transistor and/or a metal-oxide-semiconductor field effect (MOSFET) transistor (such as a complementary metal-insulator-semiconductor (CMOS) transistor), a charge storage device (such as a capacitor), a diode, an image sensor (such as a system large scale integration (LSI) or a CMOS imaging sensor (CIS)), a micro-electro-mechanical system (MEMS), an active device, a passive device, and/or the like.

A semiconductor device (e.g., including the plurality of various kinds of individual devices) may be formed on the active surface of the substrate 102. The plurality of individual devices may be electrically connected to a conductive region of the substrate 102. The semiconductor device may further include a conductive wiring line and/or a conductive plug electrically connecting at least two of the plurality of individual devices and/or the plurality of individual devices to the conductive region of the substrate 102. In addition, each of the plurality of individual devices may be electrically isolated, e.g., from other neighboring individual devices, by an insulating layer.

Both the inter-wire insulating layer IMD and the wiring layer ML may be arranged in each of the device region CR and the scribe lane region SLR. The residual metal pattern RMP may be arranged only in the scribe lane region SLR.

A plurality of inter-wire insulating layers IMD may be arranged at different vertical levels to be apart from one another. For example, the plurality of inter-wire insulating layers IMD may include a first inter-wire insulating layer IMD1, a second inter-wire insulating layer IMD2, and a third inter-wire insulating layer IMD3 sequentially arranged on the substrate 102 in a vertical direction. In FIGS. 1B and 1C, it is illustrated that the plurality of inter-wire insulating layers IMD include three inter-wire insulating layers (e.g., the first inter-wire insulating layer IMD1, the second inter-wire insulating layer IMD2, and the third inter-wire insulating layer IMD3 arranged at different vertical levels to be apart from one another). However, the example embodiments are not limited thereto. For example, the plurality of inter-wire insulating layers IMD may include no less than two and/or four (or more) inter-wire insulating layers arranged at different vertical levels to be apart from one another. The inter-wire insulating layer IMD may include an insulating material such as a high density plasma (HDP) oxide layer, a tetraethyl orthosilicate (TEOS) oxide layer, tonen silazene (TOSZ), spin on glass (SOG), undoped silica glass (USG), a low-k dielectric layer, and/or the like. In some embodiments, at least one of the first inter-wire insulating layer IMD1, the second inter-wire insulating layer IMD2, and the third inter-wire insulating layer IMD3 may include a low-k dielectric layer. The low-k dielectric layer may be a dielectric material with permittivity lower than that of silicon oxide.

A plurality of wiring layers ML may be arranged on the substrate 102 at different vertical levels to be apart from one another. For example, the plurality of wiring layers ML may include a first wiring layer ML1 and a second wiring layer ML2 that are sequentially stacked (e.g., in the vertical direction). In FIGS. 1B and 1C, it is illustrated that the plurality of wiring layers ML includes two wiring layers (e.g., the first wiring layer ML1 and the second wiring layer ML2 arranged at different vertical levels to be apart from each other). However, the example embodiments are not limited thereto. For example, in some example embodiments, the plurality of wiring layers ML may include no less than three (e.g., three or more) wiring layers arranged at different vertical levels to be apart from one another. The wiring layer ML may include a metal material such as copper (Cu), aluminum (Al), tungsten (W), and/or the like.

The plurality of inter-wire insulating layers IMD and the plurality of wiring layers ML may be alternately arranged on the substrate 102 in the vertical direction.

The residual metal pattern RMP may be a part of an uppermost wiring layer of the plurality of wiring layers ML. However, the residual metal pattern RMP is distinguished from the uppermost wiring layer ML in the scribe lane region SLR. In some embodiments, in the device region CR, a third wiring layer (not shown) may be arranged at a vertical level higher than that of the second wiring layer ML2 and may be formed together with the residual metal pattern RMP. The residual metal pattern RMP may include a metal material such as Cu, Al, W, and/or the like.

The residual metal pattern RMP may be a part of at least one of an align key, a test element group (TEG), an overlay key, a back end of site (BEOS), an oxide site (OS), an optical CD (OCD), and/or the like arranged in the scribe lane region SLR before the semiconductor chip 100 is singulated. For example, the align key may be a pattern for using photo equipment, the TEG may be a pattern for testing manufacturing processes of a semiconductor device and characteristics of the manufactured semiconductor device, the overlay key may be a pattern for measuring alignment states of a layer formed in a previous process and a layer formed in a current process, the BEOS may be a pattern for measuring a thickness of the uppermost layer after a chemical mechanical polishing (CMP) process, the OS may be a pattern for measuring a thickness of the outermost layer like the BEOS, and the OCD may be a pattern for measuring a thickness of a CD or an inside by an optical method.

In some example embodiments, a cover insulating layer 170, that does not cover at least a part of an upper surface of the residual metal pattern RMP, may be arranged on the plurality of inter-wire insulating layers IMD. For example, the cover insulating layer 170 may cover at least a part of a side surface of the residual metal pattern RMP. The cover insulating layer 170 may include the same and/or a different material as the inter-wire insulating layers IMD. For example, the cover insulating layer 170 may include at least one of a high density plasma (HDP) oxide layer, a TEOS oxide layer, TOSZ, SOG, USG, a low-k dielectric layer, and/or the like.

A protective layer 180 may cover upper surfaces of the cover insulating layer 170 and/or the residual metal pattern RMP. The protective layer 180 may include nitride. For example, the protective layer 180 may include silicon nitride.

A grooving recess GR may be adjacent to the residual metal pattern RMP. For example, the grooving recess GR may be arranged between the residual metal pattern RMP and the edge EG of the semiconductor chip 100.

The grooving recess GR may include a first recess GRS and a second recess GRD connected to each other. The first recess GRS may be two-dimensionally arranged in a limited portion between the residual metal pattern RMP and the edge EG of the semiconductor chip 100 and the second recess GRD may two-dimensionally extend from the limited portion between the residual metal pattern RMP and the edge EG of the semiconductor chip 100 outward along the edge EG of the semiconductor chip 100. In the current specification, two-dimensionally means a top view.

The grooving recess GR may directly contact the residual metal pattern RMP and the edge EG of the semiconductor chip 100. For example, the grooving recess GR may be defined by an edge of the metal pattern RMP and the edge EG. The grooving recess GR may extend from the side surface of the residual metal pattern RMP to the edge EG of the semiconductor chip 100. Therefore, the residual metal pattern RMP may be apart from the edge EG of the semiconductor chip 100 with the grooving recess GR (e.g., the first recess GRS) therebetween.

A lower surface of the residual metal pattern RMP may be at a first vertical level LV1, a lower surface of the first recess GRS may be at a second vertical level LV2 lower than the first vertical level LV1, and a lower surface of the second recess GRD may be at a third vertical level LV3 lower than the second vertical level LV2. The first recess GRS may have a first depth D1 from the lower surface of the residual metal pattern RMP and the second recess GRD may have a second depth D2 from the lower surface of the first recess GRS. For example, the first depth D1 may be a difference between the first vertical level LV1 and the second vertical level LV2 and the second depth D2 may be a difference between the second vertical level LV2 and the third vertical level LV3. The first recess GRS may be referred to as a shallow recess, and the second recess GRD may be referred to as a deep recess.

In FIGS. 1B and 1C, it is illustrated that a part of the third inter-wire insulating layer IMD3 is exposed at the lower surface of the first recess GRS and a part of the second inter-wire insulating layer IMD2 is exposed at the lower surface of the second recess GRD through the second wiring layer ML2. However, the example embodiments are not limited thereto. The lower surfaces of the first recess GRS and the second recess GRD may be lower than the first vertical level LV1 at which the lower surface of the residual metal pattern RMP is positioned and the lower surface of the second recess GRD may be lower than that of the first recess GRS. In some example embodiments, a part of the substrate 102 may be exposed at the lower surface of the second recess GRD. Alternatively, in some example embodiments, a part of the substrate 102 may be exposed at the lower surfaces of the first recess GRS and the second recess GRD.

For example, the grooving recess GR may include the first recess GRS two-dimensionally arranged in the limited portion between the residual metal pattern RMP and the edge EG of the semiconductor chip 100 and having the first depth D1 that is relatively small and the second recess GRD two-dimensionally extending from the limited portion between the residual metal pattern RMP and the edge EG of the semiconductor chip 100 outward along the edge EG of the semiconductor chip 100 and deeper than the first recess GRS by the second depth D2. The depth of the second recess GRD based on the first vertical level LV1 may be the sum of the first depth D1 and the second depth D2.

For example, the protective layer 180 may have a thickness of about 1 μm to about 2 μm. For example, the residual metal pattern RMP may have a thickness of about 1.2 μm to about 4 μm. In some example embodiments, the residual metal pattern RMP may be thicker than the protective layer 180. Thicknesses of the first wiring layer ML1 and the second wiring layer ML2 may be less than the thickness of the residual metal pattern RMP. In some example embodiments, the first depth D1 may be about 1 μm to about 4 μm, and the second depth D2 may be about 2 μm to about 6 μm. In some example embodiments, the sum of the first depth D1 and the second depth D2 may be less than about 10 μm.

Because the residual metal pattern RMP includes the grooving recess GR and is apart from the edge EG of the semiconductor chip 100, in a dicing process of singulating the semiconductor chip 100, the residual metal pattern RMP may not be directly cut off. Additionally, the recessing groove GR may have acted as a guide for crack propagation, thereby preventing (and/or mitigating the potential for) chipping and/or cracks propagating towards the device regions CR. Therefore, it is possible to prevent (and/or mitigate the potential for) the semiconductor chip 100 from being damaged in the dicing process of singulating the semiconductor chip 100 and to singulate the semiconductor chip 100 with reliability.

Figure 2A:
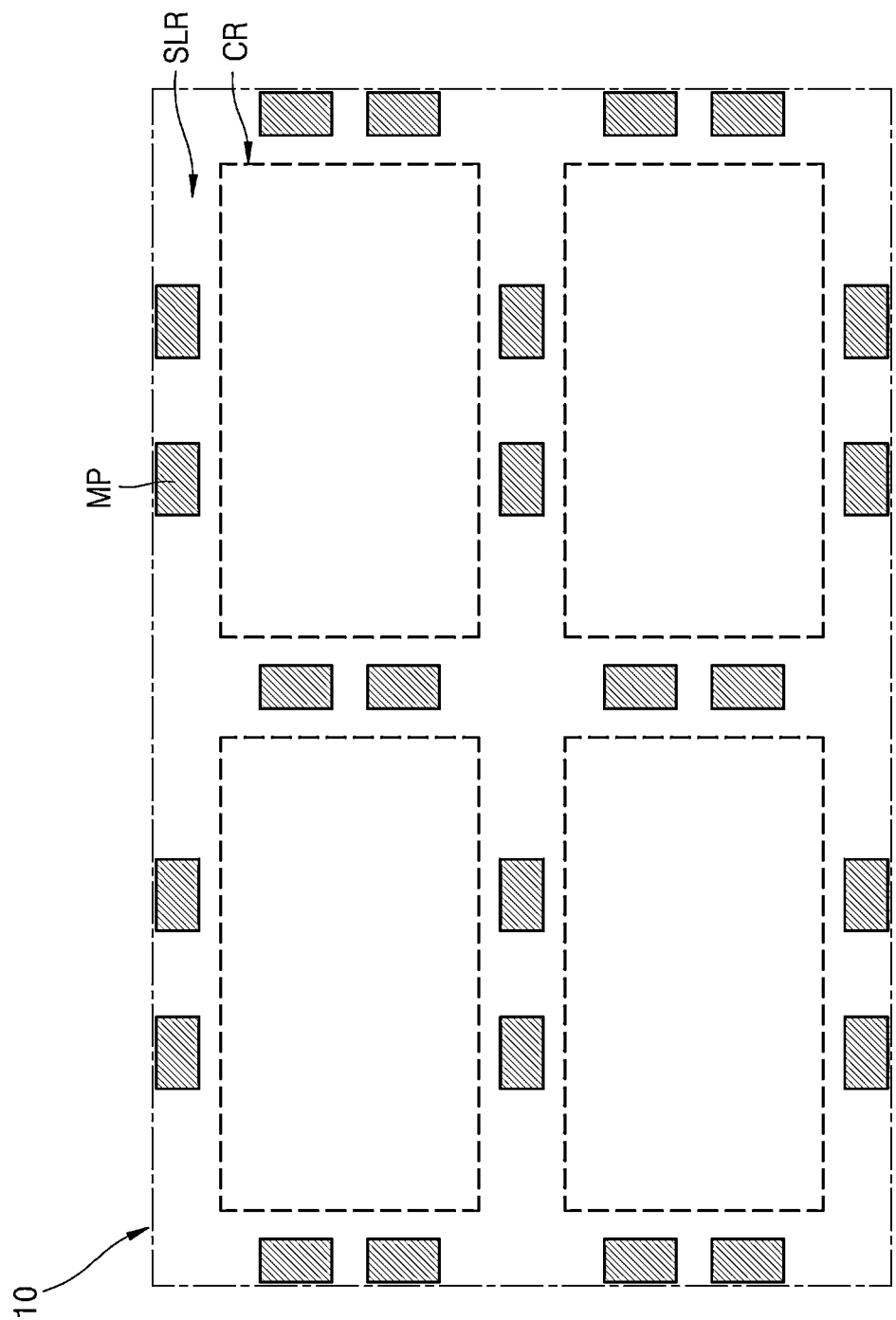
FIGS. 2A to 2C are plan layout diagrams illustrating a method of manufacturing a semiconductor chip according to some example embodiments.
Figure 2B:
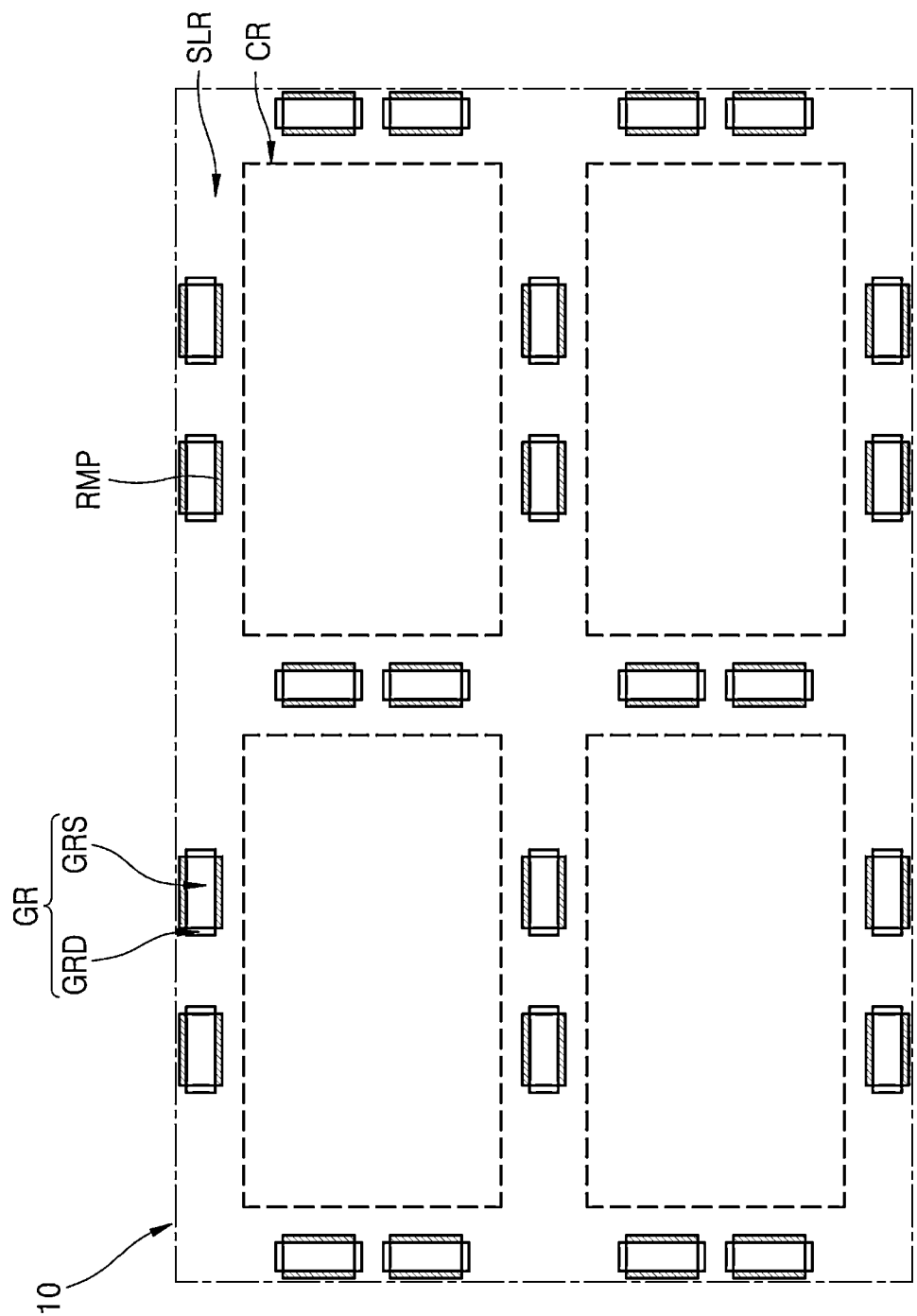
Figure 2C:
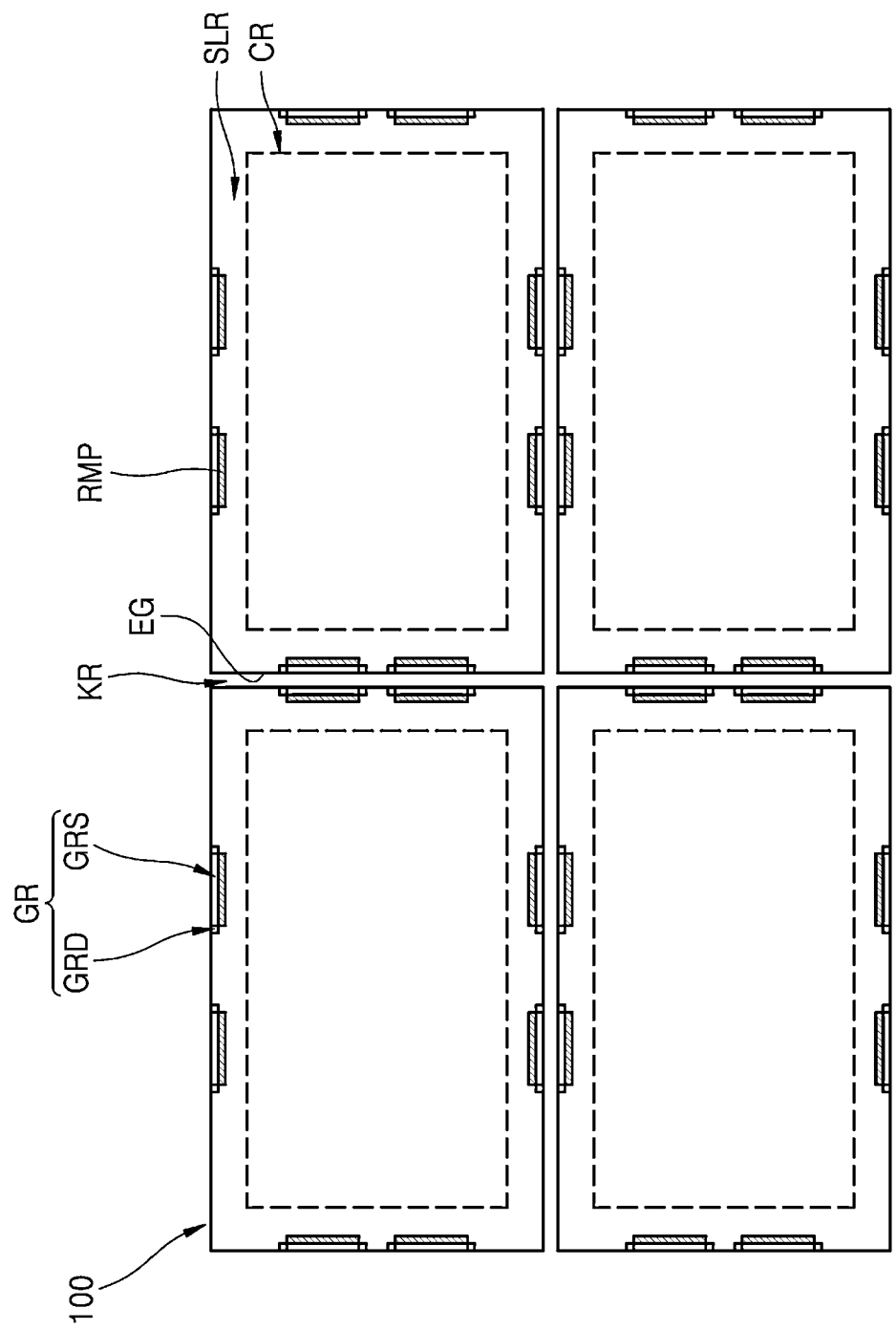

FIGS. 2A to 2C are plan layout diagrams illustrating a method of manufacturing a semiconductor chip according to some example embodiments. Specifically, FIGS. 2A to 2C are plan layout diagrams illustrating the method of manufacturing the semiconductor chip 100 illustrated in FIGS. 1A to 1C.

Referring to FIG. 2A, a semiconductor substrate 10 including a plurality of device regions CR and a scribe lane region SLR extending along the plurality of device regions CR is provided. The semiconductor substrate 10 may include, for example, a wafer. The plurality of device regions CR may be apart from one another with the scribe lane region SLR therebetween. Each of the plurality of device regions CR may be singulated to become the semiconductor chip 100 illustrated in FIGS. 1A to 1C.

A plurality of metal patterns MP may be arranged in the scribe lane region SLR. Each of the plurality of metal patterns MP may include at least one of the align key, the TEG, the overlay key, the BEOS, the OS, the OCD, and/or the lie. A part of each of the plurality of metal patterns MP may be the residual metal pattern RMP illustrated in FIGS. 1A and 1B.

Referring to FIGS. 2A and 2B, the grooving recess GR may be formed by two-dimensionally performing a grooving process of removing a part of each of the plurality of metal patterns MP and a portion adjacent thereto, for example, parts of the protective layer 180, the cover insulating layer 170, the plurality of inter-wire insulating layers IMD, and the plurality of wiring layers ML illustrated in FIGS. 1B and 1C from the scribe lane region SLR.

The grooving recess GR may include the first recess GRS and the second recess GRD connected to each other. The first recess GRS may be obtained by two-dimensionally removing a portion of the structure on which a part of each of the plurality of metal patterns MP is arranged and the second recess GRD may be obtained by two-dimensionally removing a portion of the structure adjacent to each of the plurality of metal patterns MP. For is, a portion adjacent to the portion in which the first recess GRS is formed may be removed. The first recess GRS may have a small depth because the first recess GRS is formed by removing a part of each of the plurality of metal patterns MP and the second recess GRD may have a large depth because the second recess GRD is formed by removing a portion in which each of the plurality of metal patterns MP is not arranged.

In each of the plurality of metal patterns MP, a remaining portion excluding the portion removed by forming the first recess GRS may reside as each of the plurality of residual metal patterns RMP.

Referring to FIGS. 2B and 2C, by performing the dicing process of cutting off the semiconductor substrate 10 along the scribe lane region SLR, the plurality of semiconductor chips 100 having the kerf region KR therebetween and separate from one another are formed.

The kerf region KR may cross the grooving recess GR including the first recess GRS and the second recess GRD. Therefore, the grooving recess GR may be arranged along the residual metal pattern RMP and the edge EG of the semiconductor chip 100.

The semiconductor chip 100 may include the grooving recess GR including the first recess GRS and the second recess GRD connected to each other. The first recess GRS may be two-dimensionally arranged in a limited portion between the residual metal pattern RMP and the edge EG of the semiconductor chip 100. The second recess GRD may two-dimensionally extend from the limited portion between the residual metal pattern RMP and the edge EG of the semiconductor chip 100 outward along the edge EG of the semiconductor chip 100.

The grooving recess GR may directly contact the residual metal pattern RMP and the edge EG of the semiconductor chip 100. Each of the first recess GRS and the second recess GRD may contact the edge EG of the semiconductor chip 100. The first recess GRS may directly contact the residual metal pattern RMP and the second recess GRD may not contact the residual metal pattern RMP. For example, the first recess GRS and the residual metal pattern RMP may share an edge, while the second recess GRD and the residual metal pattern RMP may not share an edge. The grooving recess GR may extend from a side surface of the residual metal pattern RMP to the edge EG of the semiconductor chip 100. Therefore, the residual metal pattern RMP may be apart from the edge EG of the semiconductor chip 100 with the grooving recess GR therebetween.

In the dicing process of cutting off the semiconductor substrate 10 to singulate the semiconductor chip 100, because the kerf region KR on which the dicing process is performed is apart from the residual metal pattern RMP, it is possible to prevent and/or mitigate the residual metal pattern RMP from being damaged in the dicing process and to singulate the semiconductor chip 100 with reliability.

Figure 3A:
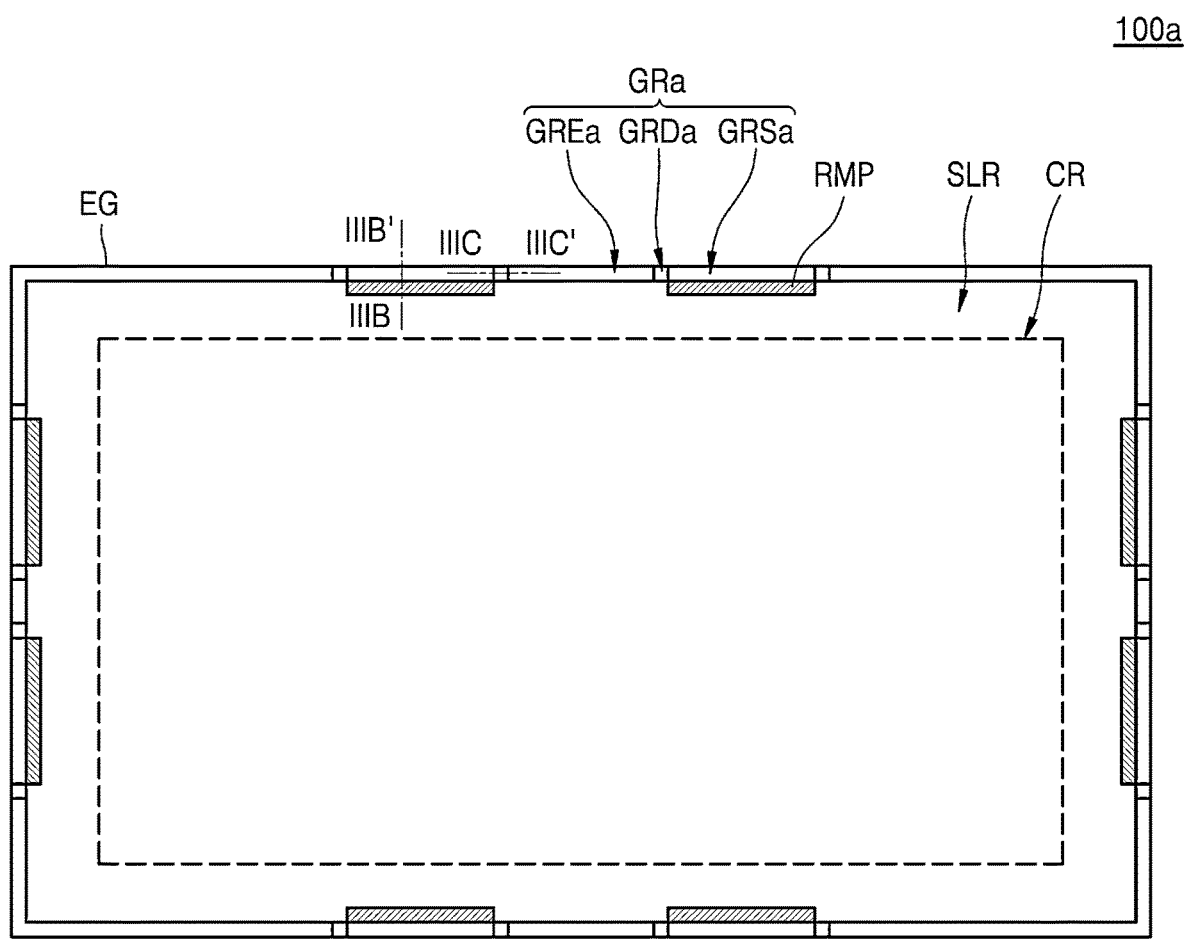
FIG. 3A is a plan layout diagram of a semiconductor chip according to some example embodiments and FIGS. 3B and 3C are cross-sectional views of the semiconductor chip of FIG. 3A.
Figure 3B:
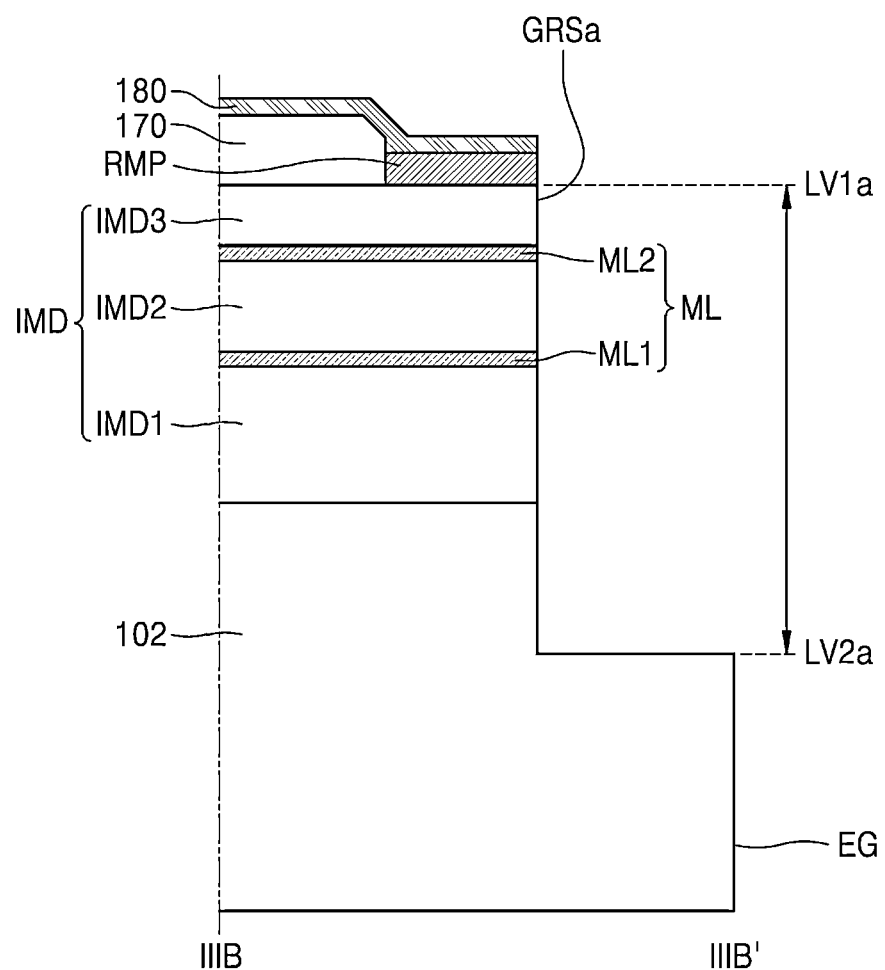
Figure 3C:
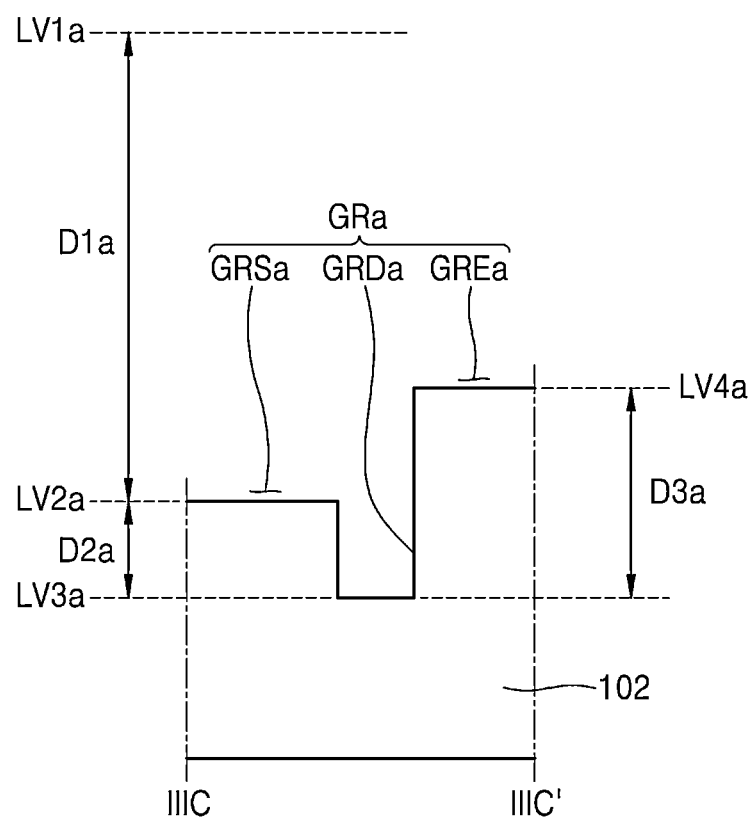

FIG. 3A is a plan layout diagram of a semiconductor chip 100a according to some example embodiments, and FIGS. 3B and 3C are cross-sectional views of the semiconductor chip 100a. Specifically, FIGS. 3B and 3C are cross-sectional views taken along the lines IIIB-IIIB' and IIIC-IIIC' of FIG. 3A, respectively. In FIGS. 3A to 3C, the same reference numerals as those of FIGS. 1A to 1C denote the same components and descriptions previously given with reference to FIGS. 1A to 1C.

Referring to FIGS. 3A to 3C, the semiconductor chip 100a includes a substrate 102 having a device region CR and a scribe lane region SLR, an inter-wire insulating layer IMD and a wiring layer ML provided on the substrate 102, and a residual metal pattern RMP provided on the inter-wire insulating layer IMD. The scribe lane region SLR may be arranged along an edge EG of the semiconductor chip 100a to surround the device region CR.

The semiconductor chip 100a may include a processor, for example, a CPU chip, a GPU chip, an AP chip, and/or the like; and/or the semiconductor chip 100a may include memory, for example, a DRAM chip, an SRAM chip, a flash memory chip, an EEPROM chip, a PRAM chip, an MRAM chip, an RRAM chip, and/or the like.

Both the inter-wire insulating layer IMD and the wiring layer ML may be arranged in both the device region CR and the scribe lane region SLR. The residual metal pattern RMP may be arranged only in the scribe lane region SLR.

The semiconductor chip 100a may include a plurality of inter-wire insulating layers IMD. The plurality of inter-wire insulating layers IMD of FIGS. 3A to 3C may be substantially similar to the plurality of inter-wire insulating layers IMD of FIGS. 1A to 1C. For example, the plurality of inter-wire insulating layers IMD may be arranged at different vertical levels to be apart from one another. For example, the plurality of inter-wire insulating layers IMD may include a first inter-wire insulating layer IMD1, a second inter-wire insulating layer IMD2, and a third inter-wire insulating layer IMD3 sequentially arranged on the substrate 102 in a vertical direction. In some embodiments, at least one of the first inter-wire insulating layer IMD1, the second inter-wire insulating layer IMD2, and the third inter-wire insulating layer IMD3 may include a low-k dielectric layer.

The semiconductor chip 100a may include a plurality of wiring layers ML. The plurality of wiring layers ML of FIGS. 3A to 3C may be substantially similar to the plurality of wiring layers ML of FIGS. 1A to 1C. For example, the plurality of wiring layers ML may be arranged on the substrate 102 at different vertical levels to be apart from one another. For example, the plurality of wiring layers ML may include a first wiring layer ML1 and a second wiring layer ML2 that are sequentially stacked.

The plurality of inter-wire insulating layers IMD and the plurality of wiring layers ML may be alternately arranged on the substrate 102 in the vertical direction.

The semiconductor chip 100a may include a residual metal pattern RMP. The residual metal pattern RMP of FIGS. 3A to 3C may be substantially similar to the residual metal pattern RMP of FIGS. 1A to 1C. For example, the residual metal pattern RMP may be a part of an align key, a TEG, an overlay key, a BEOS, an OS, an OCD and/or the like arranged in the scribe lane region SLR before the semiconductor chip 100a is singulated.

In some example embodiments, a cover insulating layer 170 that does not cover at least a part of an upper surface of the residual metal pattern RMP may be arranged on the plurality of inter-wire insulating layers IMD. A protective layer 180 may cover upper surfaces of the cover insulating layer 170 and the residual metal pattern RMP.

A grooving recess GRa may extend along the edge EG of the semiconductor chip 100a. For example, the grooving recess GRa may extend along the edge EG of the semiconductor chip 100a and may completely surround the device region CR. For example, the grooving recess GRa may extend between the residual metal pattern RMP and the edge EG of the semiconductor chip 100a.

The grooving recess GRa may include a first recess GRSa, a second recess GRDa, and a third recess GREa connected to one another. The first recess GRSa may be two-dimensionally arranged in a limited portion between the residual metal pattern RMP and the edge EG of the semiconductor chip 100a; the second recess GRDa may two-dimensionally extend from the first recess GRSa and may extend from the limited portion between the residual metal pattern RMP and the edge EG of the semiconductor chip 100a outward along a part of the edge EG of the semiconductor chip 100a; and the third recess GREa may extend from the second recess GRSa and may extend along the edge EG of the semiconductor chip 100a in which the residual metal pattern RMP is not arranged. In the grooving recess GRa, along the edge EG of the semiconductor chip 100a, the first recess GRSa, the second recess GRDa, the third recess GREa, and the second recess GRDa may be repeatedly arranged. The grooving recess GRa may be ring-shaped to extend along the edge EG of the semiconductor chip 100a and to completely surround the device region CR.

The plurality of second recesses GRDa may be arranged along the edge EG of the semiconductor chip 100a to be apart from one another and two adjacent second recesses GRDa may be connected to the first recess GRSa in a portion in which the residual metal pattern RMP is provided and may be connected to the third recess GREa in a portion in which the residual metal pattern RMP is not provided.

The first recess GRSa may directly contact the residual metal pattern RMP and the edge EG of the semiconductor chip 100a. The second recess GRDa and the third recess GREa may directly contact the edge EG of the semiconductor chip 100a and may not contact the residual metal pattern RMP. The third recess GREa may be apart from the residual metal pattern RMP with the second recess GRDa therebetween.

The first recess GRSa may extend from a side surface of the residual metal pattern RMP to the edge EG of the semiconductor chip 100a. Therefore, the residual metal pattern RMP may be apart from the edge EG of the semiconductor chip 100a with the first grooving recess GRSa therebetween.

A lower surface of the residual metal pattern RMP may be at a first vertical level LV1a, a lower surface of the first recess GRSa may be at a second vertical level LV2a lower than the first vertical level LV1a, and a lower surface of the second recess GRDa may be at a third vertical level LV3a lower than the second vertical level LV2a. A lower surface of the third recess GRDa may be at a fourth vertical level LV4a lower than the first vertical level LV1a and higher than the second vertical level LV2a.

The first recess GRSa may have a first depth D1a from the lower surface of the residual metal pattern RMP. The second recess GRDa may have a second depth D2a from the lower surface of the first recess GRSa, and the third recess GREa may have a third depth D3a from the lower surface of the third recess GREa. For example, the first depth D1a may be a difference between the first vertical level LV1a and the second vertical level LV2a, the second depth D2a may be a difference between the second vertical level LV2a and the third vertical level LV3a, and the third depth D3a may be a difference between the fourth vertical level LV4a and the third vertical level LV3a. The first recess GRSa may be referred to as a shallow recess, the second recess GRDa may be referred to as a deep recess, and the third recess GREa may be referred to as an extended recess.

In some example embodiments, a part of the substrate 102 may be exposed at the lower surfaces of the first recess GRSa, the second recess GRDs, and the third recess GREa.

The first depth D1a may be about 5 μm to about 10 μm and the second depth D2a may be about 2 μm to about 6 μm. The third depth D3a may be about 4 μm to about 8 μm.

Because the residual metal pattern RMP includes the grooving recess GRa and is apart from the edge EG of the semiconductor chip 100a, in a dicing process of singulating the semiconductor chip 100a, the residual metal pattern RMP may not be directly cut off. Therefore, it is possible to prevent (and/or mitigate the potential for) the semiconductor chip 100a from being damaged in the dicing process of singulating the semiconductor chip 100a and to singulate the semiconductor chip 100a with reliability.

Figure 4A:
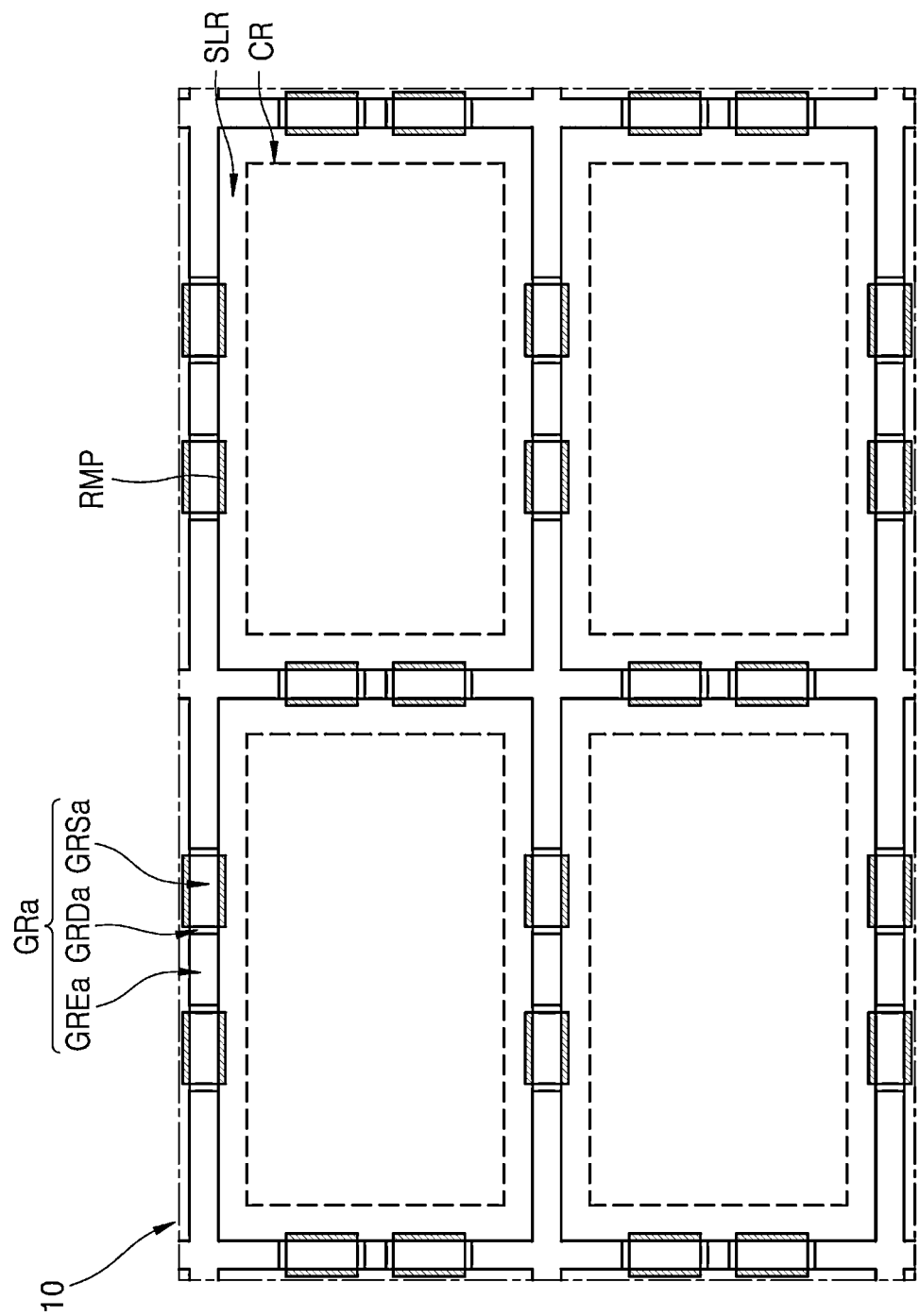
FIGS. 4A and 4B are plan layout diagrams illustrating a method of manufacturing a semiconductor chip according to some example embodiments.
Figure 4B:
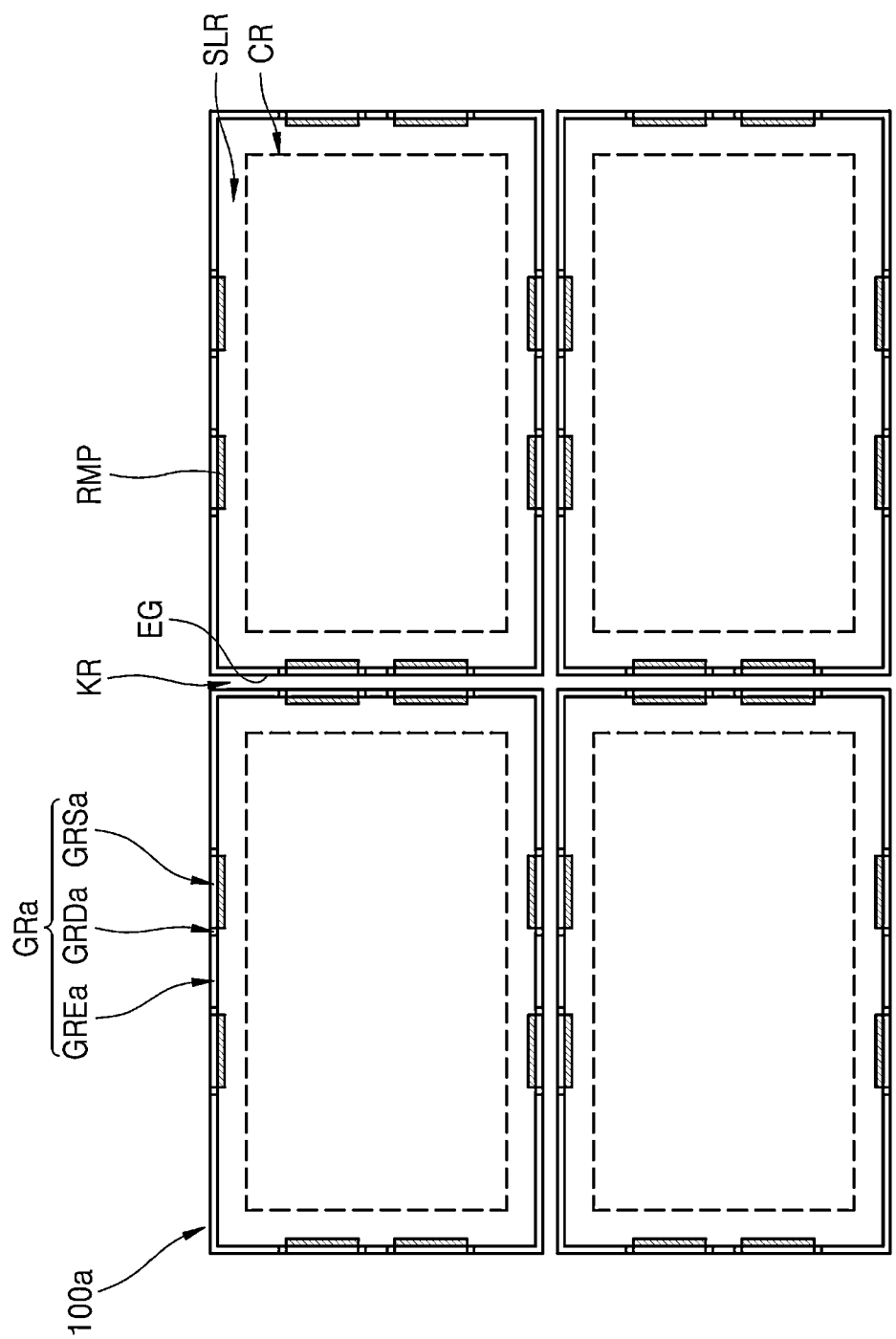

FIGS. 4A and 4B are plan layout diagrams illustrating a method of manufacturing a semiconductor chip 100a according to some example embodiments. Specifically, FIGS. 2A, 2B, 4A, and 4B are plan layout diagrams illustrating a method of manufacturing the semiconductor chip 100a illustrated in FIGS. 3A to 3C.

As illustrated in FIGS. 2A and 2B, after providing a semiconductor substrate 10 including a plurality of device regions CR and a scribe lane region SLR extending along the plurality of device regions CR, by two-dimensionally performing a first grooving process of removing parts of a plurality of metal patterns MP and portions adjacent thereto from the scribe lane region SLR, the grooving recess GR may be formed. In this section, with regards to FIGS. 4A and 4B, the grooving recess GR illustrated in FIG. 2B may be referred to as a spare grooving recess GR to be distinguished from the grooving recess GRa illustrated in FIGS. 4A and 4B and the first recess GRS and the second recess GRD illustrated in FIG. 2B may be referred to as a first spare recess GRS and a second spare recess GRD to be distinguished from the first recess GRSa and the second recess GRDa illustrated in FIGS. 4A and 4B.

Referring to FIG. 4A, by performing a second grooving process along the scribe lane region SLR, the grooving recess GRa two-dimensionally surrounding the device region CR may be formed. The grooving recess GRa may surround the device region CR while overlapping the spare grooving recess GR illustrated in FIG. 2B in the vertical direction.

By performing the second grooving process, the first recess GRSa, which is deeper than the first spare recess GRS, may be formed in the first spare recess GRS illustrated in FIG. 2B, the second recess GRDa, which is deeper than the second spare recess GRD, may be formed in the second spare recess GRD, and the third recess GREa may be formed in a portion in which the first spare recess GRS and the second spare recess GRD are not formed.

The grooving recess GRa may include a first recess GRSa, a second recess GRDa, and a third recess GREa connected to one another. The third recess GREa may have a small depth because the third recess GREa is formed in a portion in which the first spare recess GRS and the second spare recess GRD are not formed. The second recess GRDa may have a large depth because the second recess GRDa is formed in a portion in which the second spare recess GRD is formed. The first recess GRSa may have a depth greater than that of the third recess GREa and less than that of the second recess GRDa because the first recess GRSa is formed in a portion in which the first spare recess GRS is formed.

Referring to FIGS. 4A and 4B, by performing the dicing process of cutting off the semiconductor substrate 10 along the scribe lane region SLR, the plurality of semiconductor chips 100a having the kerf region KR therebetween and separate from one another are formed.

The kerf region KR may be formed along the grooving recess GRa including the first recess GRSa, the second recess GRDa, and the third recess GREa. Therefore, the grooving recess GRa may be arranged between the residual metal pattern RMP and the edge EG of the semiconductor chip 100a and may extend along the edge EG of the semiconductor chip 100a.

In the dicing process of cutting off the semiconductor substrate 10 to singulate the semiconductor chip 100a, because the kerf region KR on which the dicing process is performed is apart from the residual metal pattern RMP and the plurality of inter-wire insulating layers IMD illustrated in FIGS. 3B and 3C, at least parts of which may-include low-k dielectric layers, it is possible to prevent (and/or mitigate the potential for) the residual metal pattern RMP and the plurality of inter-wire insulating layers IMD from being damaged in the dicing process and to singulate the semiconductor chip 100a with reliability.

Figure 5A:
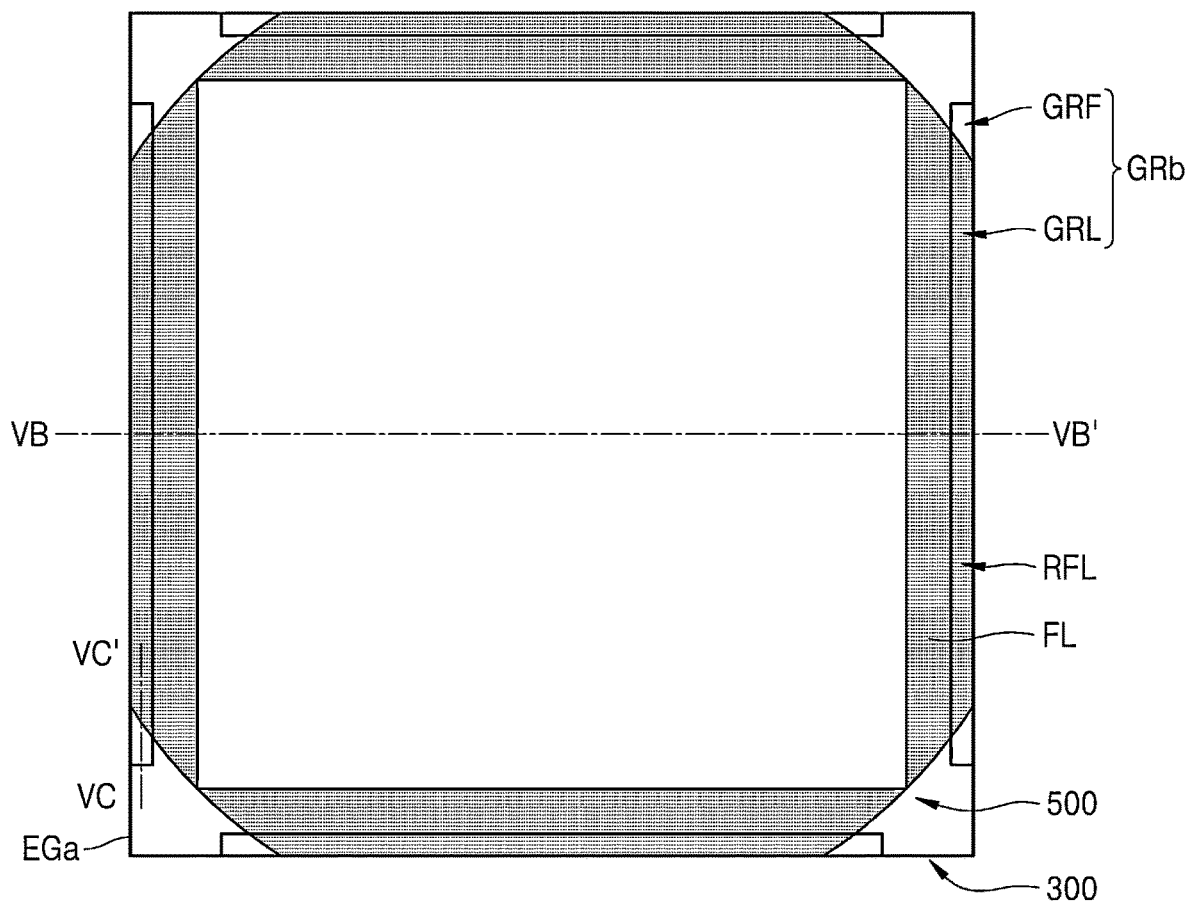
FIG. 5A is a plan layout diagram of a semiconductor package according to some example embodiments and FIGS. 5B and 5C are cross-sectional views of the semiconductor package of FIG. 5A.
Figure 5B:
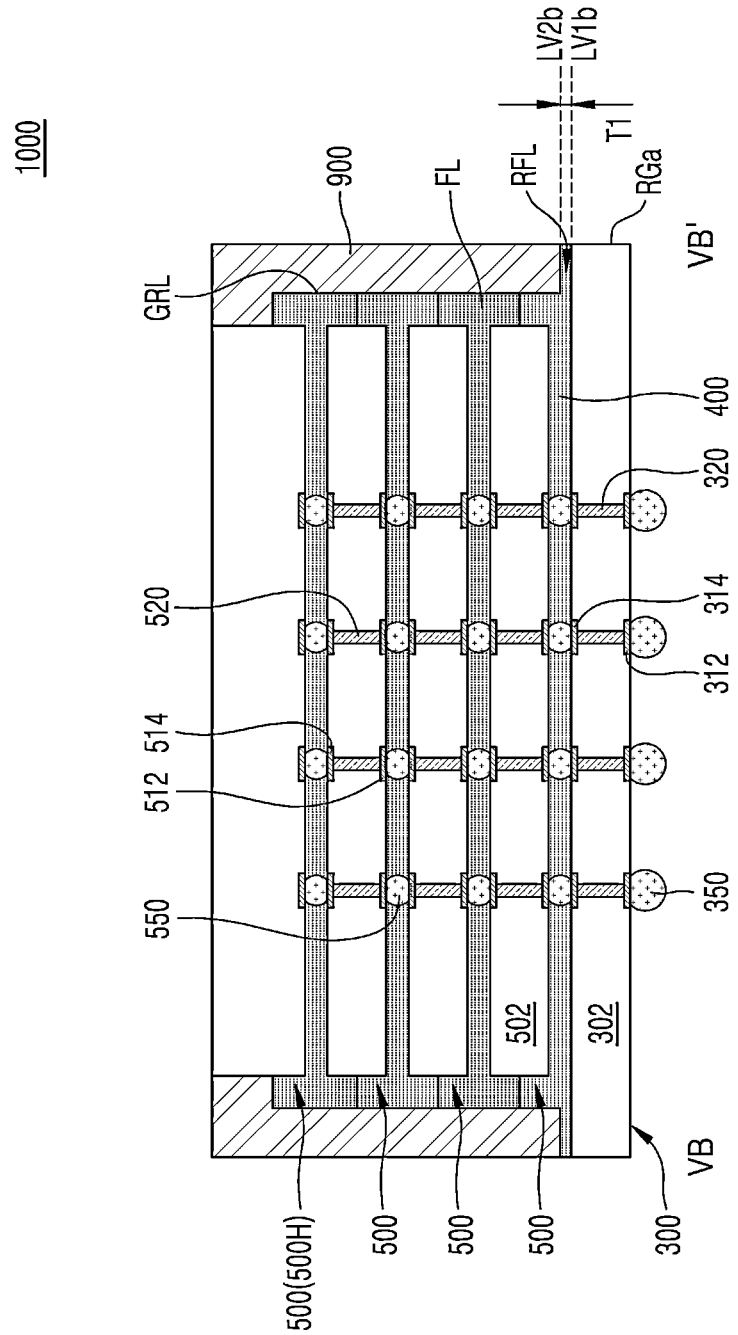
Figure 5C:
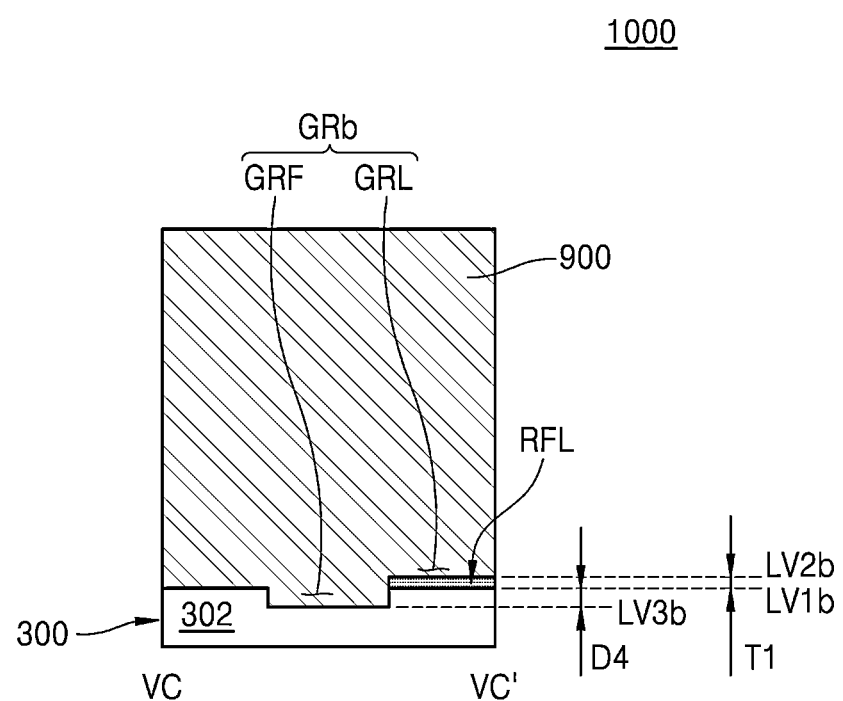

FIG. 5A is a plan layout diagram of a semiconductor package 1000 according to some example embodiments, and FIGS. 5B and 5C are cross-sectional views of the semiconductor package 1000. Specifically, FIGS. 5B and 5C are cross-sectional views taken along the lines VB-VB' and VC-VC' of FIG. 5A.

Referring to FIGS. 5A to 5C, the semiconductor package 1000 includes a first semiconductor chip 300 and a plurality of second semiconductor chips 500 stacked on the first semiconductor chip 300. In FIGS. 5B and 5C, the semiconductor package 1000 is illustrated as including four second semiconductor chips 500. However, the example embodiments are not limited thereto. For example, the semiconductor package 1000 may include two or more second semiconductor chips 500. In some example embodiments, the number of second semiconductor chips 500 included in the semiconductor package 1000 may be a multiple of two and/or four. The plurality of second semiconductor chips 500 may be sequentially stacked on the first semiconductor chip 300 in the vertical direction. The first semiconductor chip 300 and the plurality of second semiconductor chips 500 may be sequentially stacked with active surfaces thereof, on which a second semiconductor device is formed, facing downward.

The first semiconductor chip 300 includes a first substrate 302 with an active surface on which a first semiconductor device is formed, a plurality of first front surface connection pads 312 and a plurality of first rear surface connection pads 314 respectively arranged on the active surface and an inactive surface of the first substrate 302, and a plurality of first through electrodes 320 electrically connecting the plurality of first front surface connection pads 312 to the plurality of first rear surface connection pads 314 through at least a part of the first substrate 302.

The second semiconductor chip 500 includes a second substrate 502 with the active surface, a plurality of second front surface connection pads 512 and a plurality of second rear surface connection pads 514 respectively arranged on the active surface and an inactive surface of the second substrate 502, and a plurality of second through electrodes 520 electrically connecting the plurality of second front surface connection pads 512 to the plurality of second rear surface connection pads 514 through at least a part of the second substrate 502. The plurality of second through electrodes 520 may be electrically connected to the plurality of first through electrodes 320.

Because the first substrate 302 and/or the second substrate 502 may be substantially the same as the substrate 102 described with reference to FIGS. 1A to 1C (and/or FIGS. 3A to 3C), redundant description thereof is omitted.

The first semiconductor chip 300 may be a buffer chip including a serial-parallel conversion circuit, and at least one of the second semiconductor chips 500 may be a memory semiconductor chip including a memory cell. In some example embodiments, the first semiconductor chip 300 may be a buffer chip for controlling high bandwidth memory dynamic random access memory (HBM DRAM) and the at least one second semiconductor chip 500 may be a memory semiconductor chip having a cell of the HBM DRAM controlled by the first semiconductor chip 300. The first semiconductor chip 300 may be referred to as a master, primary, controller, and/or leader chip, and the second semiconductor chip 500 may be referred to as a slave, secondary, agent, and/or follower chip.

A plurality of first connection terminals 350 may be attached onto the plurality of first front surface connection pads 312 of the first semiconductor chip 300. A plurality of second connection terminals 550 may be attached onto the plurality of second front surface connection pads 512 of each of the plurality of second semiconductor chips 500. The plurality of second connection terminals 550 may electrically connect the plurality of first rear surface connection pads 314 of the first semiconductor chip 300 to the plurality of second front surface connection pads 512 of the lowermost second semiconductor chip 500, among the plurality of second semiconductor chips 500, and the plurality of second rear surface connection pads 514 of each of the plurality of second semiconductor chips 500 to the plurality of second front surface connection pads 512 of each of the plurality of second semiconductor chips 500.

A horizontal width of the first semiconductor chip 300 may be greater than a horizontal width of each of the plurality of second semiconductor chips 500.

In some example embodiments, among the plurality of second semiconductor chips 500, the uppermost second semiconductor chip 500H farthest from the first semiconductor chip 300 may not include the plurality of second rear surface connection pads 514 and the plurality of second through electrodes 520. In some example embodiments, among the plurality of second semiconductor chips 500, a thickness of the uppermost second semiconductor chip 500H farthest from the first semiconductor chip 300 may be greater than thicknesses of the other second semiconductor chips 500.

An insulating adhesive layer 400 may be between the first semiconductor chip 300 and each of the plurality of second semiconductor chips 500. The insulating adhesive layer 400 may be attached to a lower surface of each of the plurality of second semiconductor chips 500 and may attach each of the plurality of second semiconductor chips 500 onto a lower structure, for example, the first semiconductor chip 300 (and/or another lower second semiconductor chip 500 among the plurality of second semiconductor chips 500). The insulating adhesive layer 400 may include a non-conductive film (NCF), non-conductive paste (NCP), insulating polymer, epoxy resin, and/or the like. The insulating adhesive layer 400 may fill a space between the first semiconductor chip 300 and each of the plurality of second semiconductor chips 500 while surrounding the plurality of second connection terminals 550.

The insulating adhesive layer 400 may have an adhesive fillet FL protruding from the space between the first semiconductor chip 300 and each of the plurality of second semiconductor chips 500 outward. The adhesive fillet FL may cover at least a part of a side surface of each of the plurality of second semiconductor chips 500 and at least a part of an upper surface of the first semiconductor chip 300. For example, the adhesive fillet FL may have a residual fillet RFL covering at least a part of the upper surface of the first semiconductor chip 300.

A grooving recess GRb may extend along an edge EGa of the first semiconductor chip 300 adjacent to the adhesive fillet FL. In some example embodiments, the grooving recess GRb may contact the edge EGa of the first semiconductor chip 300. The grooving recess GRb may include a first recess GRL and a second recess GRF. Each of the first recess GRL and the second recess GRF may contact the edge EGa of the first semiconductor chip 300.

The grooving recess GRb may extend along the edge EGa of the first semiconductor chip 300 with a generally constant horizontal width. In some embodiments, the grooving recess GRb may extend along the edge EGa of the first semiconductor chip 300 with a width of about 5 μm to about 50 μm. For example, the first recess GRL and the second recess GRF (e.g., the grooving recess GRb) may be two-dimensionally bar-shaped and/or rectangular to extend along the edge EGa of the first semiconductor chip 300.

In some example embodiments, the semiconductor package 1000 may include four grooving recesses GRb adjacent to four edges EGa of the first semiconductor chip 300 and apart from one another. One grooving recess GRb adjacent to one edge EGa of the first semiconductor chip 300 may include one first recess GRL and two second recesses GRF. One grooving recess GRb adjacent to one edge EGa of the first semiconductor chip 300 may include two second recesses GRF arranged on both sides of one first recess GRL along the one first recess GRL and the one edge EGa of the first semiconductor chip 300.

The first recess GRL may extend from the uppermost surface of the adhesive fillet FL to the first semiconductor chip 300 thereunder. In some example embodiments, the first recess GRL may extend from the uppermost surface of the adhesive fillet FL and may not extend to the lowermost surface of the adhesive fillet FL (for example, to the upper surface of the first semiconductor chip 300). The first recess GRL may be formed by removing a part of the adhesive fillet FL and may be adjacent to the edge EGa of the first semiconductor chip 300.

The residual fillet RFL may extend to the edge EGa of the first semiconductor chip 300. The residual fillet RFL may contact the edge EGa of the first semiconductor chip 300. The residual fillet RFL may be a part of the adhesive fillet FL arranged under a lower surface of the first recess GRL formed by removing a part of the adhesive fillet FL. The residual fillet RFL may have a first thickness T1 that is much less than a thickness of the adhesive fillet FL, which is several hundreds of μm. For example, the first thickness T1 may be about 1 μm to about 10 μm.

The second recess GRF may be two-dimensionally arranged in a part of the upper surface of the first semiconductor chip 300 adjacent to the first recess GRL (e.g., a part of the upper surface of the first semiconductor chip 300 adjacent to the residual fillet RFL). The second recess GRF may be formed by removing a part of the upper surface (e.g., the inactive surface of the first substrate 302) in a grooving process of removing a part of the adhesive fillet FL. The second recess GRF may extend from the uppermost surface of the first semiconductor chip 300 to an inside of the first semiconductor chip 300. The second recess GRF may directly contact the residual fillet RFL.

The uppermost surface of the first semiconductor chip 300 may be at a first vertical level LV1*b* and an upper surface of the residual fillet RFL (e.g., a lower surface of the first recess GRL may be at a second vertical level LV2*b* that is higher than the first vertical level LV1*b*). For example, the first thickness T1 may be a difference between the first vertical level LV1*b* and the second vertical level LV2*b*. A lower surface of the second recess GRF may be at a third vertical level LV3*b* that is lower than the first vertical level LV1*b*, and the second recess GRF may have a fourth depth D4 from the uppermost surface of the first semiconductor chip 300. That is, the fourth depth D4 may be a difference between the first vertical level LV1*b* and the third vertical level LV3*b*. For example, the fourth depth D4 may be about 1 μm to about 5 μm.

The semiconductor package 1000 may further include a molding layer 900 surrounding the plurality of second semiconductor chips 500 and the insulating adhesive layer 400 on the first semiconductor chip 300. The molding layer 900 may fill the grooving recess GRb including the first recess GRL and the second recess GRF. The molding layer 900 may include, for example, an epoxy mold compound. In some embodiments, the molding layer 900 may not cover an upper surface of the uppermost second semiconductor chip 500H.

In the adhesive fillet FL, a thick portion excluding the residual fillet RFL may be apart from the edge EGa of the first semiconductor chip 300 with the grooving recess GRb therebetween. Therefore, in a dicing process of singulating the semiconductor package 1000, the thick portion of the adhesive fillet FL may not be directly cut off. Therefore, it is possible to prevent (and/or mitigate) the semiconductor package 1000 from being damaged in the dicing process and to singulate the semiconductor package 1000 with reliability.

Figure 6A:
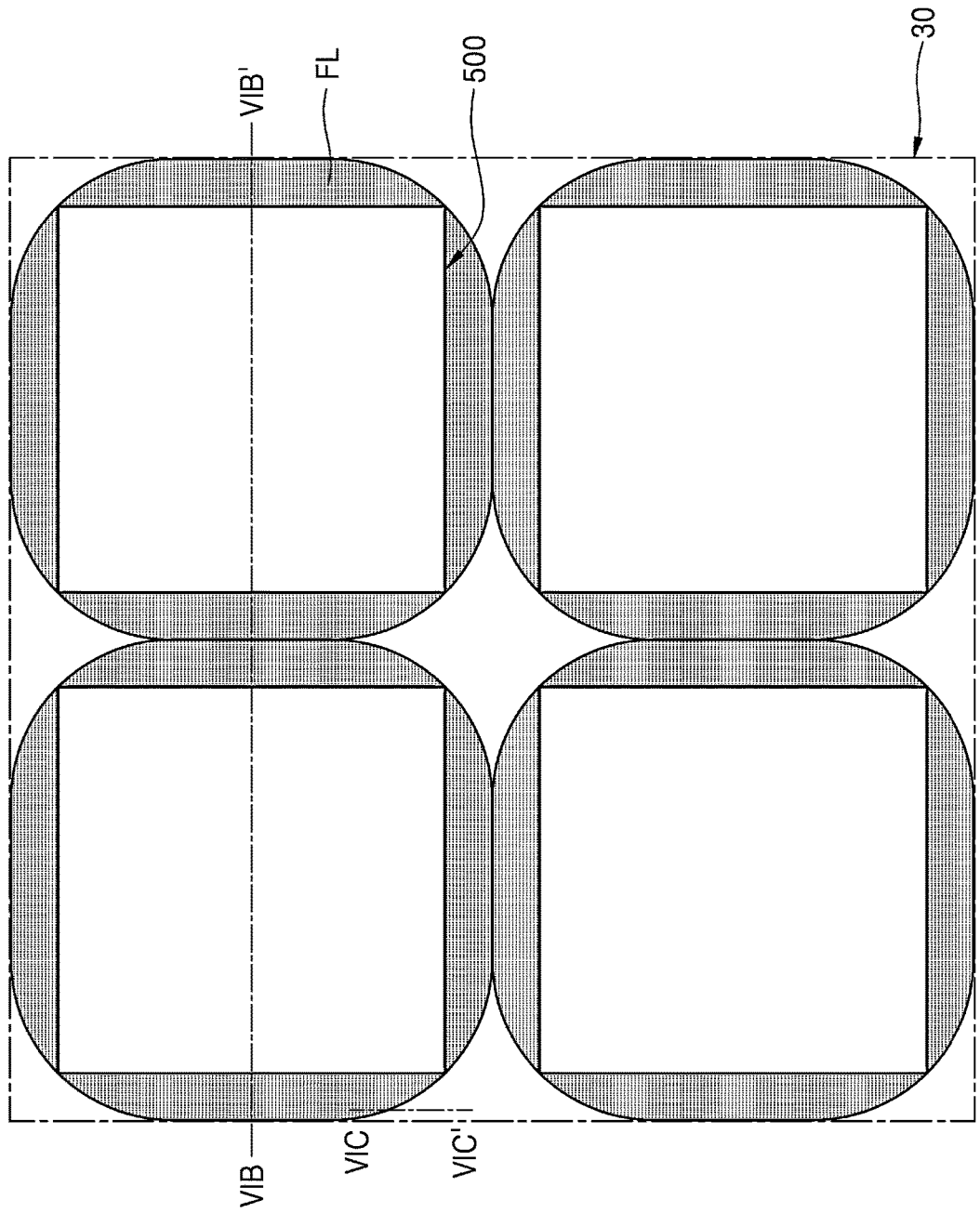

FIGS. 6A to 8 are plan layout diagrams and cross-sectional views illustrating a method of manufacturing a semiconductor package 1000 according to some example embodiments. Specifically, FIGS. 6A to 8 are plan layout diagrams illustrating a method of manufacturing the semiconductor package 1000 illustrated in FIGS. 5A to 5C, FIGS. 6B and 6C are cross-sectional views taken along the lines VIB-VIB' and VIC-VIC' of FIG. 6A, and FIGS. 7B and 7C are cross-sectional views taken along the lines VIIB-VIIB' and VIIC-VIIC' of FIG. 7A.

Figure 6B:
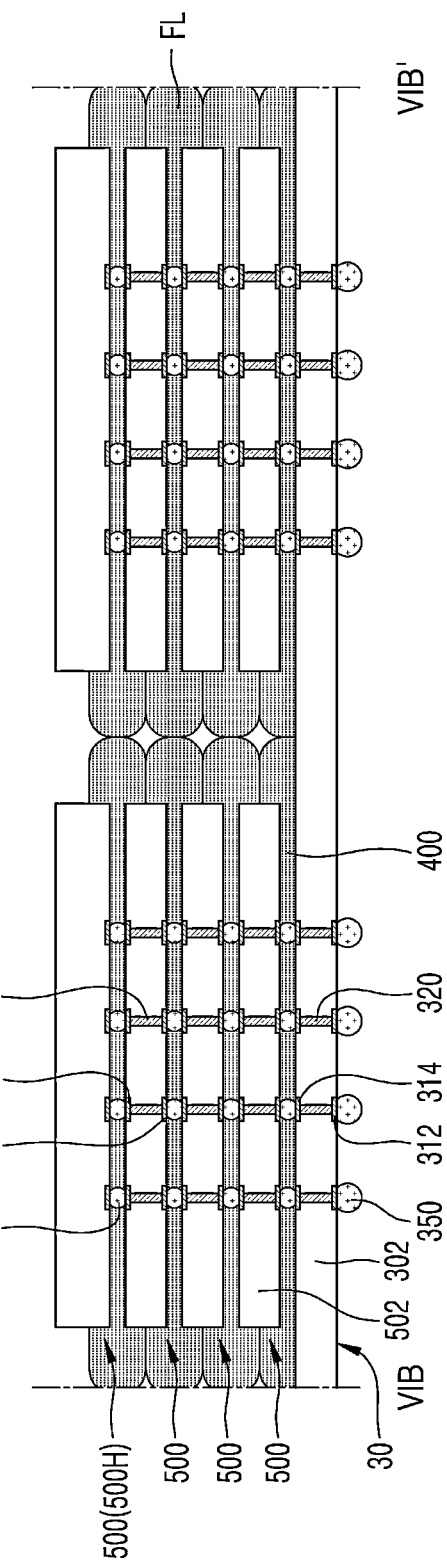
Figure 6C:
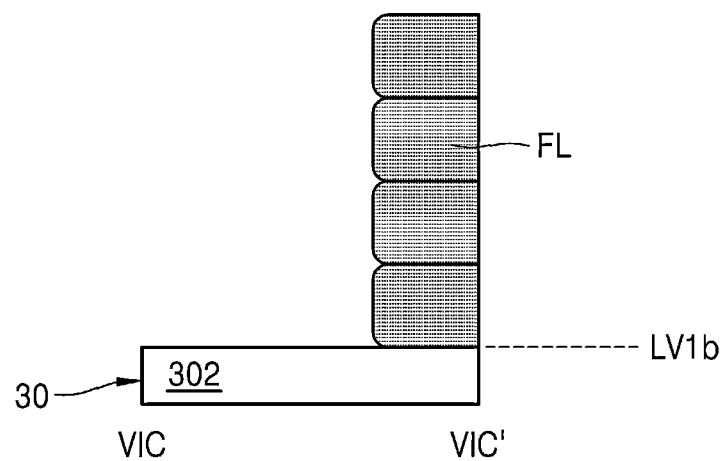

Referring to FIGS. 6A to 6C, a semiconductor substrate 30 is provided. The semiconductor substrate 30 may be, for example, a wafer. When the semiconductor substrate 30 is separated by a dicing process, the plurality of first semiconductor chips 300 illustrated in FIGS. 5A to 5C may be formed.

The plurality of second semiconductor chips 500 are stacked on the semiconductor substrate 30. On the semiconductor substrate 30, a plurality of chip stacked structures, in each of which the plurality of second semiconductor chips 500 are stacked, may be apart from each other.

An insulating adhesive layer 400 may be between the semiconductor chip 30 and each of the plurality of second semiconductor chips 500. The insulating adhesive layer 400 may have an adhesive fillet FL protruding from a space between the first semiconductor chip 300 and each of the plurality of second semiconductor chips 500 outward. In some example embodiments, the adhesive fillets FL protruding outward in the adjacent chip stacked structures may contact one another.

Figure 7A:
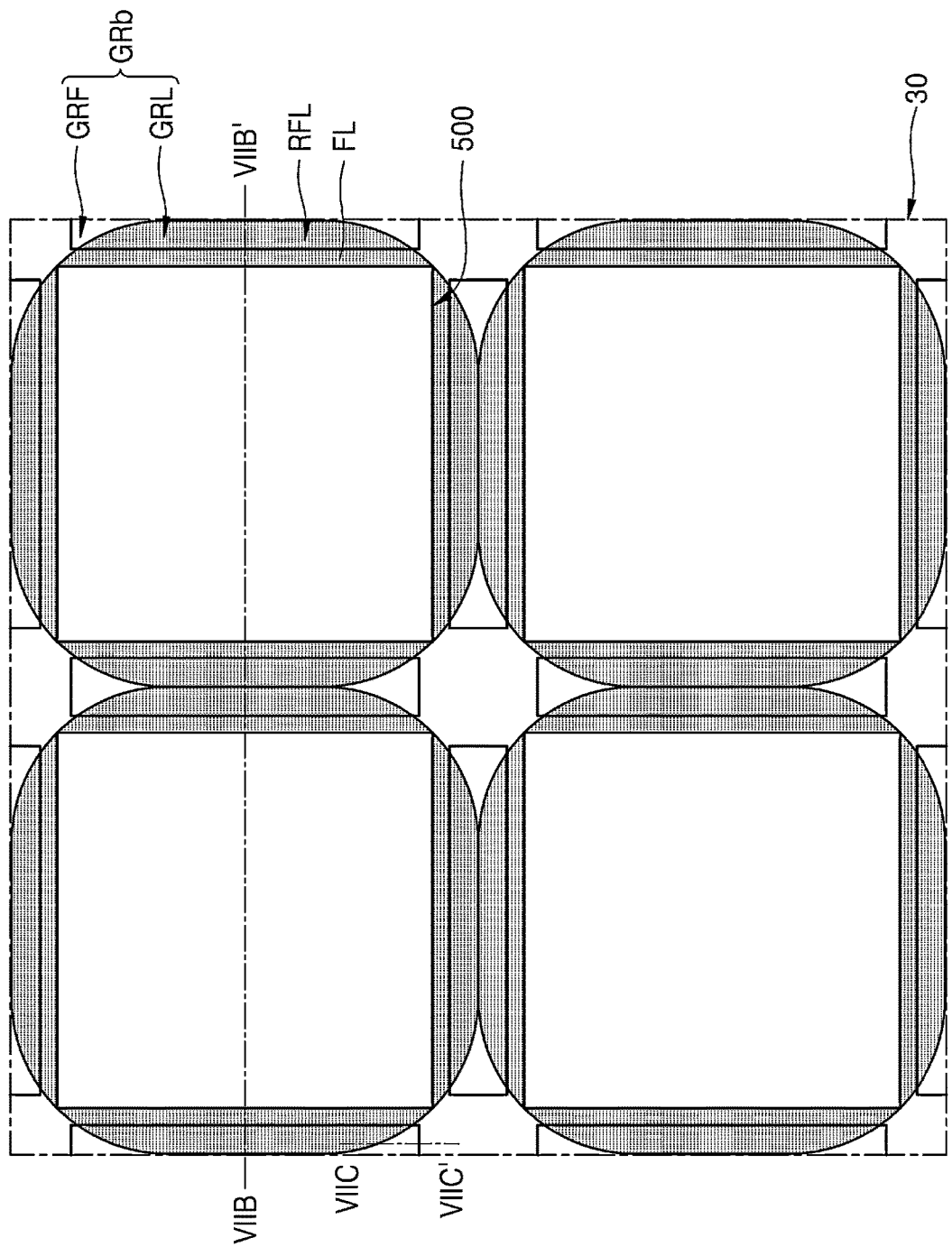
Figure 7B:
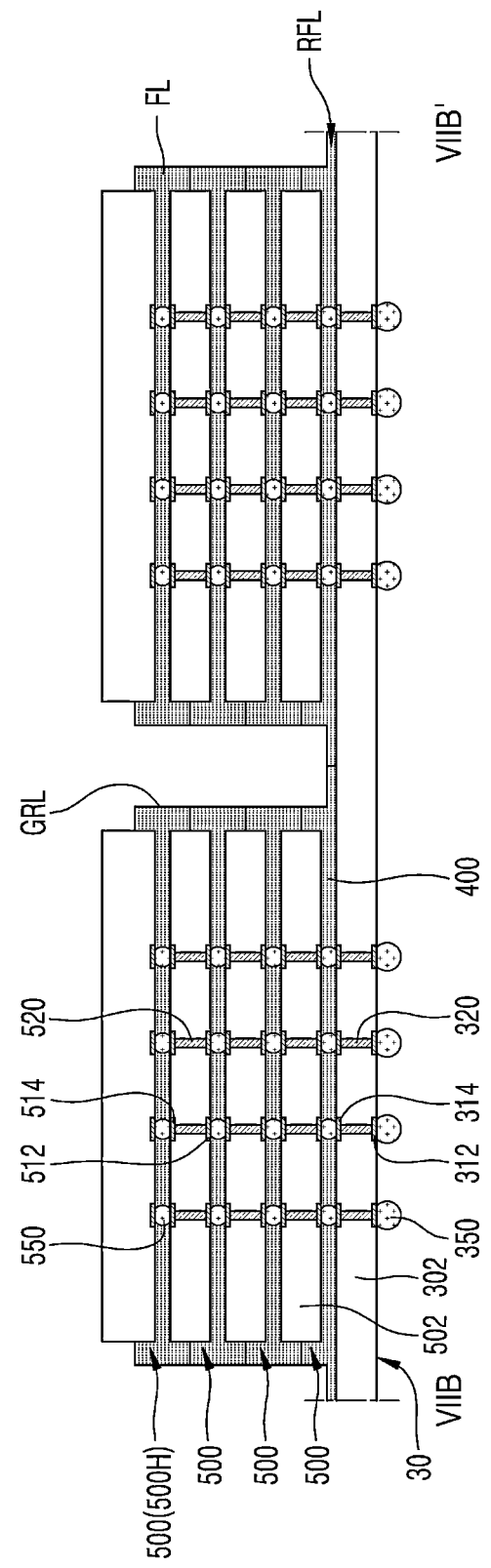
Figure 7C:
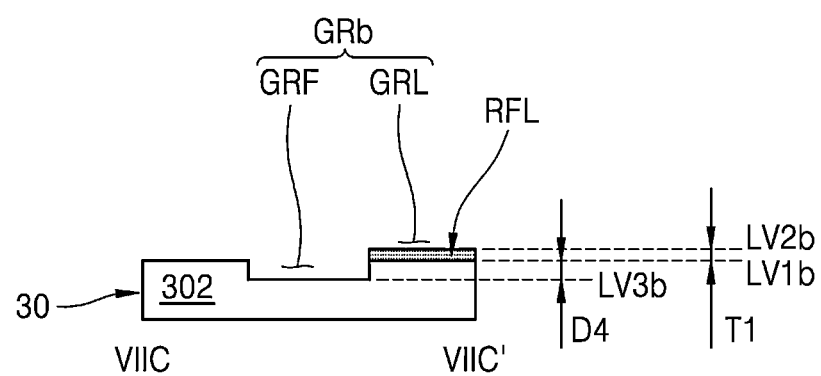

Referring to FIGS. 7A to 7C, a grooving recess GRb including a first recess GRL, obtained by removing a part of the adhesive fillet FL, and a second recess GRF, obtained by removing a part of the semiconductor substrate 30 adjacent to the adhesive fillet FL while removing a part of the adhesive fillet FL, is formed by performing a grooving process. A first substrate 302 may not be exposed at a lower surface of the first recess GRL, and a residual fillet RFL may be exposed at the lower surface of the first recess GRL. The residual fillet RFL may be a part of the adhesive fillet FL covering an upper surface of the first substrate 302 without being removed in a process of removing the adhesive fillet FL in order to form the first recess GRL.

The uppermost surface of the first semiconductor chip 300 may be at a first vertical level LV1*b*, an upper surface of the residual fillet RFL may be at a second vertical level LV2*b* that is higher than the first vertical level LV1*b*, and a lower surface of the second recess GRF may be at a third vertical level LV3*b* that is lower than the first vertical level LV1*b*.

Referring to FIG. 8, the molding layer 900 illustrated in FIGS. 5B and 5C surrounding the plurality of second semiconductor chips 500 and the insulating adhesive layer 400 is formed on the semiconductor substrate 30 illustrated in FIGS. 7A to 7C. The molding layer 900 may fill the grooving recess GRb including the first recess GRL and the second recess GRF.

Then, by performing a dicing process of cutting off the molding layer 900 and the semiconductor substrate 30 along the grooving recess GRb, the plurality of semiconductor packages 1000 separate from one another with a kerf region KRa therebetween are formed. The semiconductor package 1000 includes the first semiconductor chip 300 and the plurality of second semiconductor chips 500 stacked on the first semiconductor chip 300.

The adhesive fillet FL may be apart from the edge EGa of the first semiconductor chip 300 formed by the kerf region KRa with the grooving recess GRb therebetween. In the dicing process of cutting off the semiconductor substrate 30 and singulating the semiconductor package 1000, a thick portion of the adhesive fillet FL (e.g., a portion of the adhesive fillet FL excluding the residual fillet RFL) may not be directly cut off. Therefore, it is possible to prevent (and/or mitigate the potential for) the semiconductor package 1000 from being damaged in the dicing process and to singulate the semiconductor package 1000 with reliability.

Figure 9A:
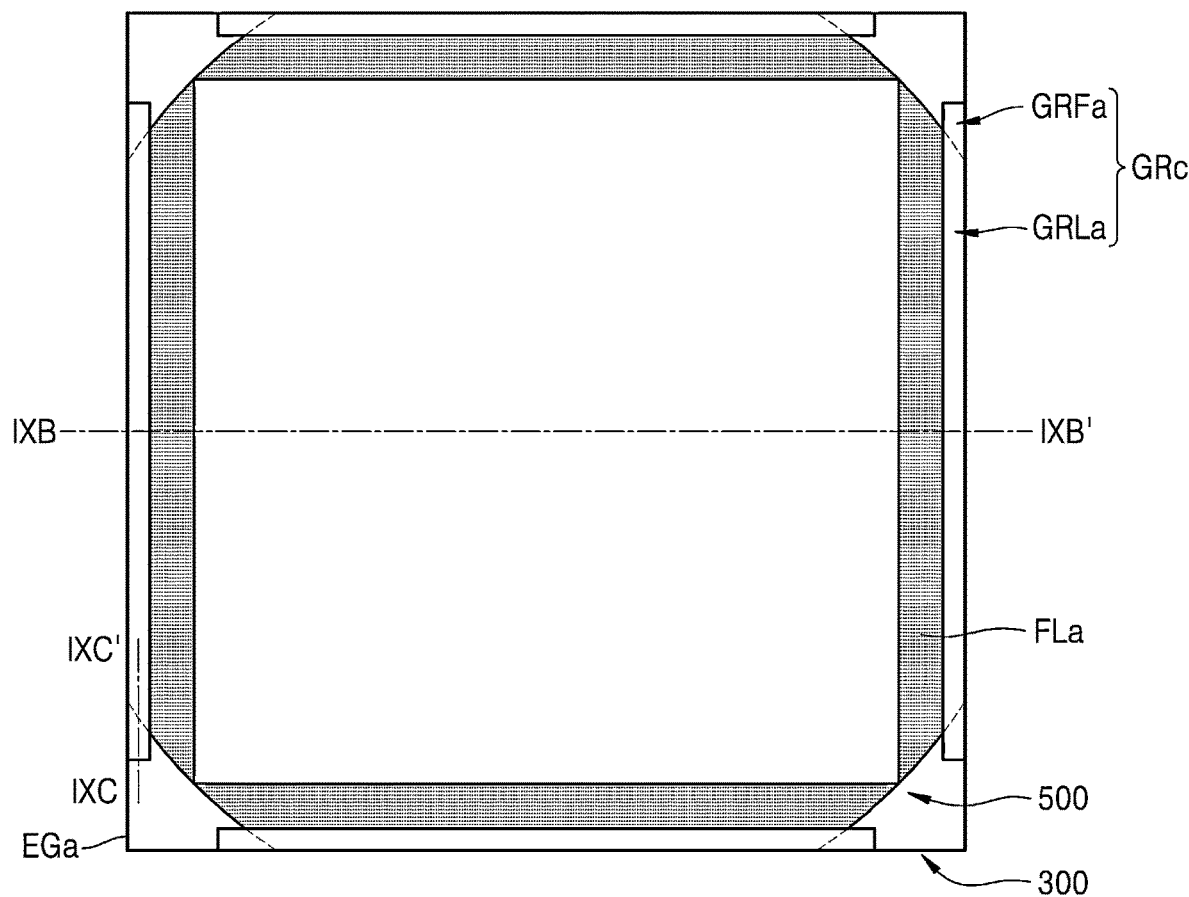
FIG. 9A is a plan layout diagram of a semiconductor package according to some example embodiments and FIGS. 9B and 9C are cross-sectional views of the semiconductor package of FIG. 9A.
Figure 9B:
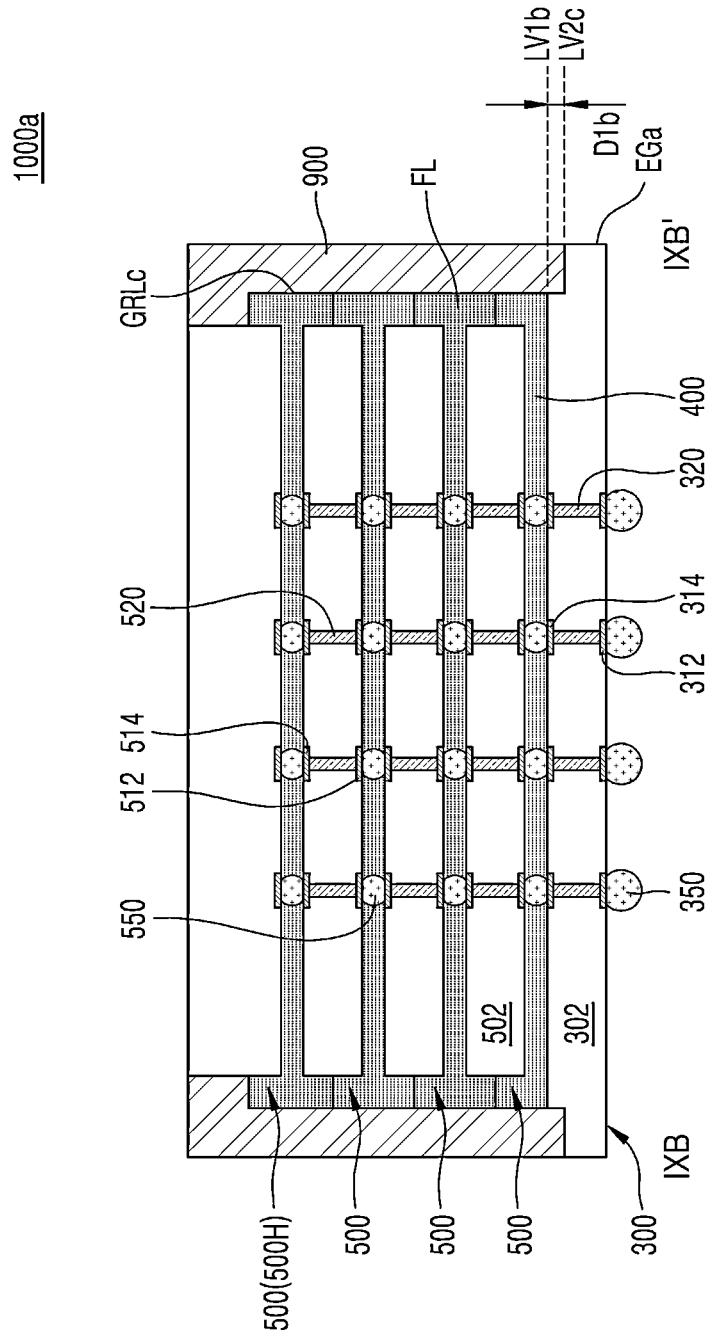
Figure 9C:
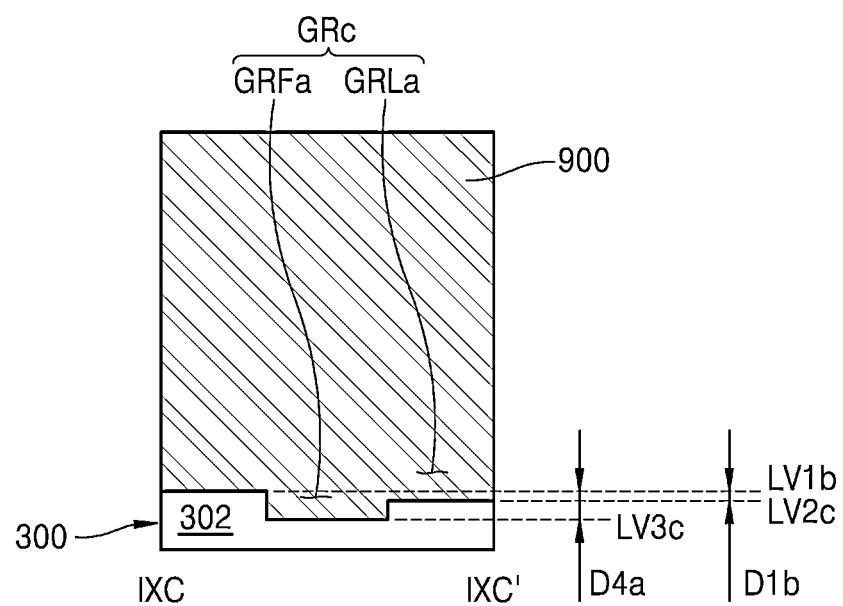

FIG. 9A is a plan layout diagram of a semiconductor package 1000*a* according to embodiments of the inventive concept, and FIGS. 9B and 9C are cross-sectional views of a semiconductor package 1000*a*. Specifically, FIGS. 9B and 9C are cross-sectional views taken along the lines IXB-IXB' and IXC-IXC' of FIG. 9A. In FIGS. 9A to 9C, the same reference numerals as those of FIGS. 5A to 5C denote the same components and descriptions previously given with reference to FIGS. 5A to 5C.

Referring to FIGS. 9A to 9C, the semiconductor package 1000*a* includes a first semiconductor chip 300 and a plurality of second semiconductor chips 500 stacked on the first semiconductor chip 300.

An insulating adhesive layer 400 may be between the first semiconductor chip 300 and each of the plurality of second semiconductor chips 500. The insulating adhesive layer 400 may have an adhesive fillet FLa protruding from a space between the first semiconductor chip 300 and each of the plurality of second semiconductor chips 500 outward. The adhesive fillet FLa may cover at least a part of a side surface of each of the plurality of second semiconductor chips 500. The adhesive fillet FLa may be apart from an edge EGa of the first semiconductor chip 300. For example, the adhesive fillet FLa does not have a residual fillet RFL that the adhesive fillet FL illustrated in FIGS. 5A to 5C has and a portion of the upper surface of the first semiconductor chip 300 may be exposed (e.g., to the molding layer 900). The adhesive fillet FLa may be apart from the edge EGa of the first semiconductor chip 300.

A grooving recess GRc may extend along the edge EGa of the first semiconductor chip 300 adjacent to the adhesive fillet FLa. The grooving recess GRc may include a first recess GRLa and a second recess GRFa. The first recess GRLa and the second recess GRFa may be two-dimensionally bar-shaped and/or rectangular to extend along the edge EGa of the first semiconductor chip 300. Each of the first recess GRLa and the second recess GRFa may contact the edge EGa of the first semiconductor chip 300.

The first recess GRLa may extend from the uppermost surface of the adhesive fillet FLa to the first semiconductor chip 300 thereunder. The first recess GRLa may be formed through the uppermost surface of the adhesive fillet FLa to the lowermost surface thereof. In some example embodiments, the first recess GRLa may extend from the uppermost surface of the adhesive fillet FLa so that the first semiconductor chip 300 may be exposed at a lower surface of the first recess GRLa. The first recess GRLa may be arranged between the adhesive fillet FLa and the edge EGa of the first semiconductor chip 300.

The second recess GRFa may be two-dimensionally arranged in a part of the upper surface of the first semiconductor chip 300 adjacent to the first recess GRLa. The first recess GRLa may be connected to the second recess GRFa.

The uppermost surface of the first semiconductor chip 300 may be at a first vertical level LV1$b$ and a lower surface of the first recess GRLa may be at a second vertical level LV2$c$ that is lower than the first vertical level LV1$b$. The first recess GRLa may have a first depth D1$b$ from the first vertical level LV1$b$ at which the uppermost surface of the first semiconductor chip 300 is positioned. The first depth D1$b$ may be a difference between the first vertical level LV1$b$ and the second vertical level LV2$c$. A lower surface of the second recess GRFa may be at a third vertical level LV3$c$ lower than the first vertical level LV1$b$ and the second vertical level LV2$c$ and the second recess GRFa may have a fourth depth D4$a$ from the uppermost surface of the first semiconductor chip 300. That is, the fourth depth D4$a$ may be a difference between the first vertical level LV1$b$ and the third vertical level LV3$c$.

The adhesive fillet FLa may be apart from the edge EGa of the first semiconductor chip 300 with a grooving recess GRb therebetween. Therefore, in a dicing process of singulating the semiconductor package 1000$a$, a thick portion of the adhesive fillet FLa may not be directly cut off. Therefore, according to the inventive concept, it is possible to prevent (and/or mitigate the potential of) the semiconductor package 1000$a$ from being damaged in the dicing process and to singulate the semiconductor package 1000$a$ with reliability.

Figure 10B:
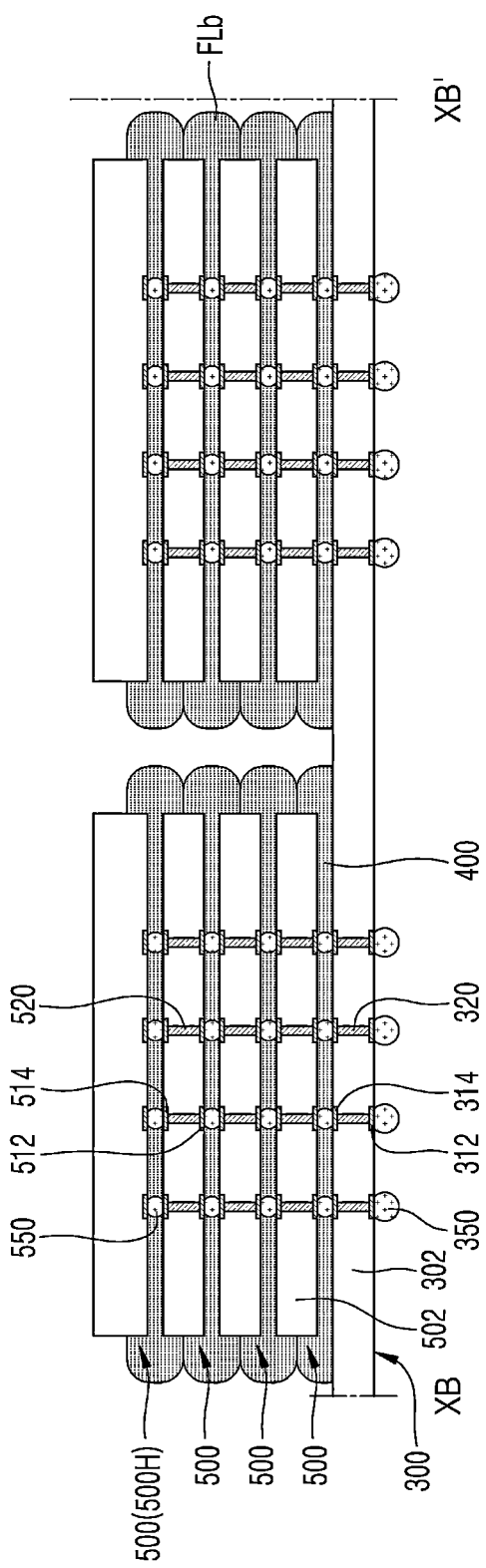
Figure 11A:
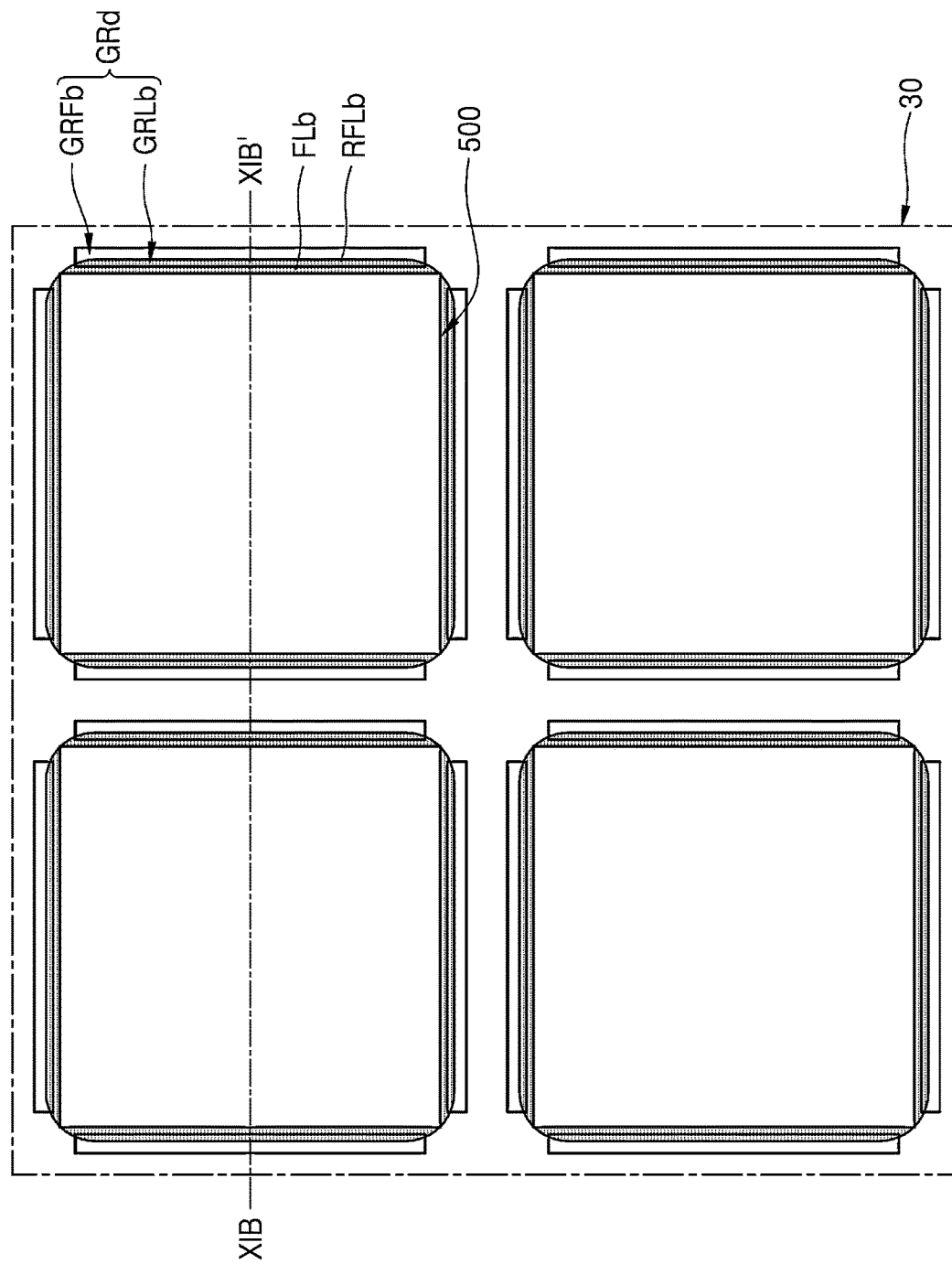
Figure 11B:
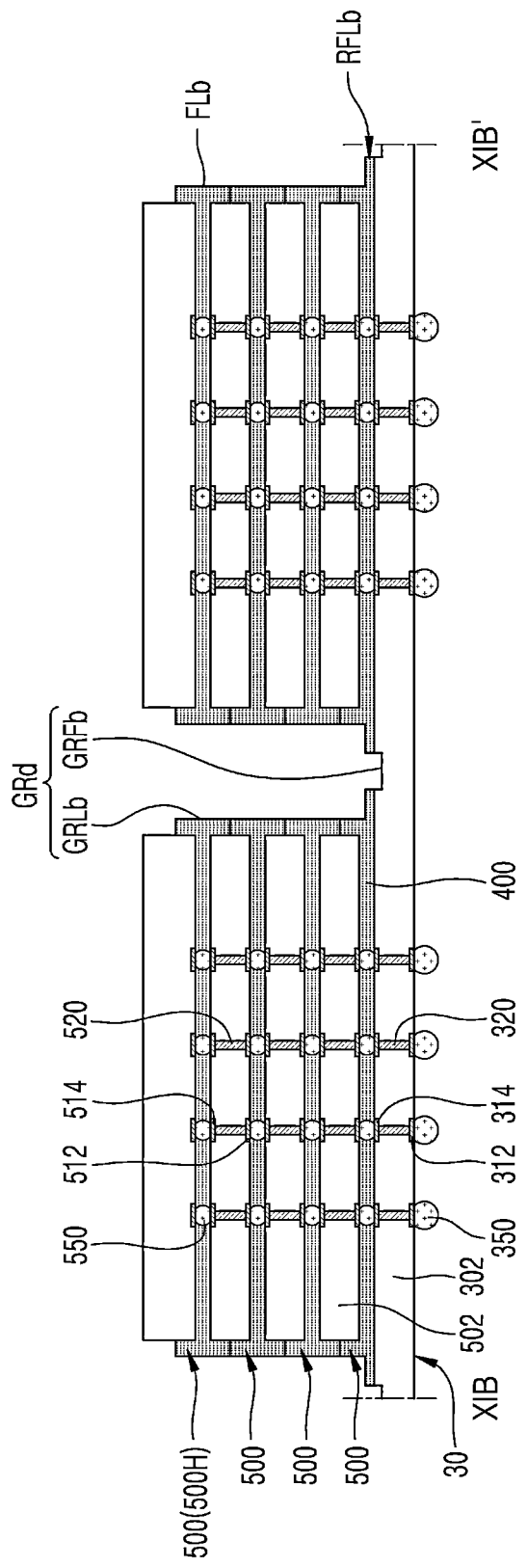
Figure 12B:
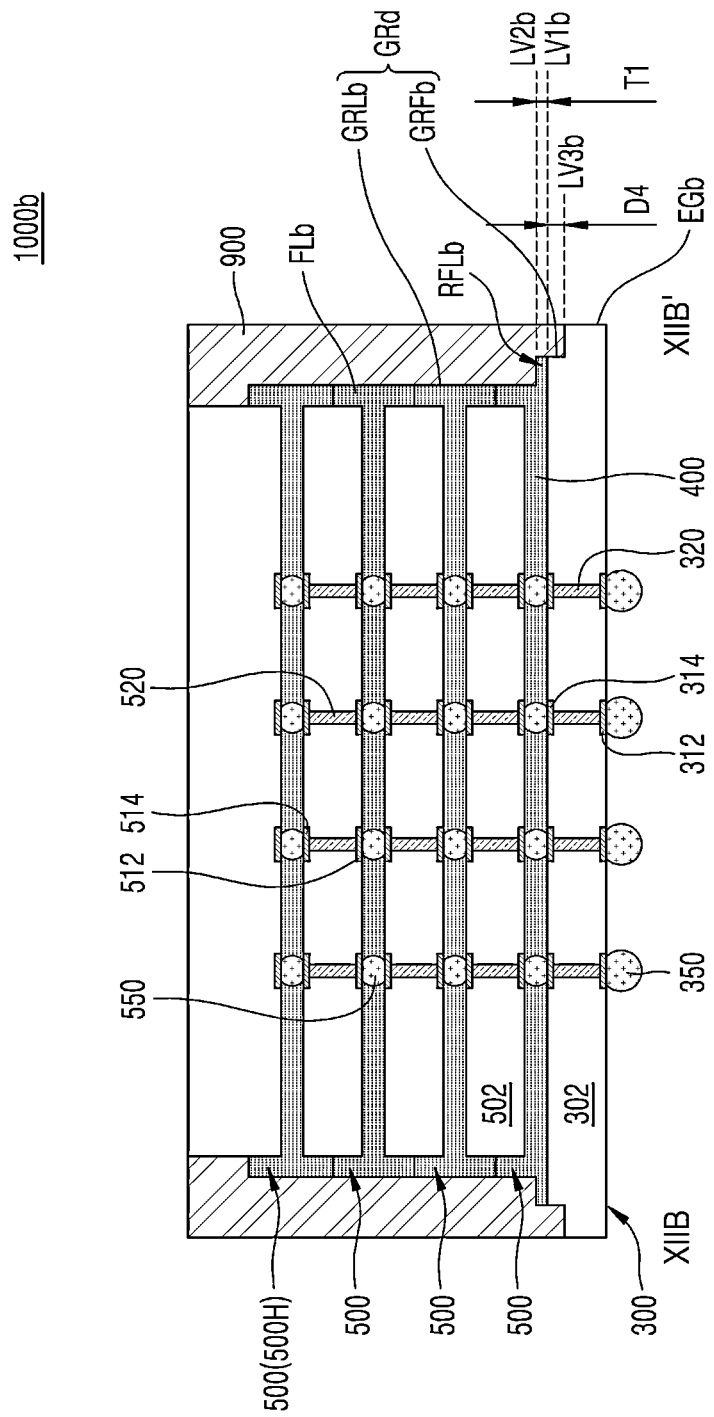

FIGS. 10A to 12B are plan layout diagrams and cross-sectional views illustrating a method of manufacturing a semiconductor package 1000$b$ according to some example embodiments and a semiconductor package 1000$b$ manufactured by the method. Specifically, FIG. 10B is a cross-sectional view taken along the line XB-XB' of FIG. 10A, FIG. 11B is a cross-sectional view taken along the line XIB-XIB' of FIG. 11A, and FIG. 12B is a cross-sectional view taken along the line XIIB-XIIB' of FIG. 12A. In FIGS. 10A to 12B, the same reference numerals as those of FIGS. 5A to 8 denote the same components and descriptions previously given with reference to FIGS. 5A to 8.

Referring to FIGS. 10A and 10B, a plurality of second semiconductor chips 500 are stacked on a semiconductor substrate 30. On the semiconductor substrate 30, a plurality of chip stacked structures, in each of which the plurality of second semiconductor chips 500 are stacked, may be apart from each other. An insulating adhesive layer 400 may be between the semiconductor chip 30 and each of the plurality of second semiconductor chips 500. The insulating adhesive layer 400 may have an adhesive fillet FLb protruding from a space between a first semiconductor chip 300 and each of the plurality of second semiconductor chips 500 outward. In some example embodiments, the adhesive fillets FLb protruding outward in the adjacent chip stacked structures may not contact one another and may be apart from one another.

Referring to FIGS. 11A and 11B, a grooving recess GRd including a first recess GRLb, obtained by removing a part of the adhesive fillet FLb, and a second recess GRFb, obtained by removing a part of the semiconductor substrate 30 adjacent to the adhesive fillet FLb while removing a part of the adhesive fillet FLb, is formed by performing a grooving process. A first substrate 302 may not be exposed at a lower surface of the first recess GRLb and a residual fillet RFLb may be exposed at the lower surface of the first recess GRLb. The residual fillet RFLb may be a part of the adhesive fillet FLb covering an upper surface of the first substrate 302 without being removed in a process of removing the adhesive fillet FLb in order to form the first recess GRLb.

Referring to FIGS. 12A and 12B, a molding layer 900 surrounding the plurality of second semiconductor chips 500 and the insulating adhesive layer 400 is formed on the semiconductor substrate 30 illustrated in FIGS. 11A and 11B. The molding layer 900 may fill the grooving recess GRd including the first recess GRLb and the second recess GRFb.

Then, by performing a dicing process of cutting off the molding layer 900 and the semiconductor substrate 30 along the grooving recess GRd, the plurality of semiconductor packages 1000$b$ separate from one another with a kerf region KRa therebetween are formed. The semiconductor package 1000$b$ includes the first semiconductor chip 300 and the plurality of second semiconductor chips 500 stacked on the first semiconductor chip 300.

The grooving recess GRd may extend along an edge EGb of the first semiconductor chip 300 adjacent to an adhesive fillet FLb. The grooving recess GRd may include a first recess GRLb and a second recess GRFb. The first recess GRLb and the second recess GRFb may be two-dimensionally bar-shaped and/or rectangular to extend along the edge EGb of the first semiconductor chip 300. The second recess GRFb may contact the edge EGb of the first semiconductor chip 300. The first recess GRLb may be apart from the edge EGb of the first semiconductor chip 300 with the second recess GRFb therebetween.

In some example embodiments, the semiconductor package 1000$b$ may include four grooving recesses GRd adjacent to four edges EGb of the first semiconductor chip 300 and apart from one another. At least one grooving recess GRd adjacent to at least one edge EGb of the first semiconductor chip 300 may include one first recess GRLb and two second recesses GRFb. One grooving recess GRd adjacent to one edge EGb of the first semiconductor chip 300 may include one first recess GRLb adjacent to the plurality of second semiconductor chips 500 and one second recesses GRFb adjacent to the one edge EGb of the first semiconductor chip 300.

For example, the uppermost surface of the first semiconductor chip 300 may be at a first vertical level LV1b and an upper surface of the residual fillet RFLb (e.g., a lower surface of the first recess GRLb, may be at a second vertical level LV2b that is higher than the first vertical level LV1b). In some example embodiments, the first thickness T1 may be a difference between the first vertical level LV1b and the second vertical level LV2b. A lower surface of the second recess GRFb may be at a third vertical level LV3b that is lower than the first vertical level LV1b, and the second recess GRFb may have a fourth depth D4 from the uppermost surface of the first semiconductor chip 300. That is, the fourth depth D4 may be a difference between the first vertical level LV1b and the third vertical level LV3b. For example, the fourth depth D4 may be about 1 μm to about 5 μm.

The first recess GRL and the second recess GRF illustrated in FIGS. 5A to 5C are arranged along the edge EGa of the first semiconductor chip 300. However, the first recess GRLb and the second recess GRFb illustrated in FIGS. 12A and 12B may be sequentially arranged from the second semiconductor chip 500 to the edge EGb of the first semiconductor chip 300. For example, the first recess GRLb may be arranged toward the second semiconductor chip 500 in comparison with the second recess GRFb, and the second recess GRFb may be arranged toward the edge EGb of the first semiconductor chip 300 in comparison with the first recess GRLb. In some example embodiments, the second recess GRFb may directly contact the edge EGb of the first semiconductor chip 300.

The adhesive fillet FLb may be apart from the edge EGb of the first semiconductor chip 300 formed by the kerf region KRa with the grooving recess GRd therebetween. Therefore, in a dicing process of cutting off the semiconductor substrate 30 to singulate the semiconductor package 1000b, the adhesive fillet FLb may not be directly cut off. Therefore, it is possible to prevent (and/or mitigate the potential for) the semiconductor package 1000b from being damaged in the dicing process and to singulate the semiconductor package 1000b with reliability.

Figure 13A:
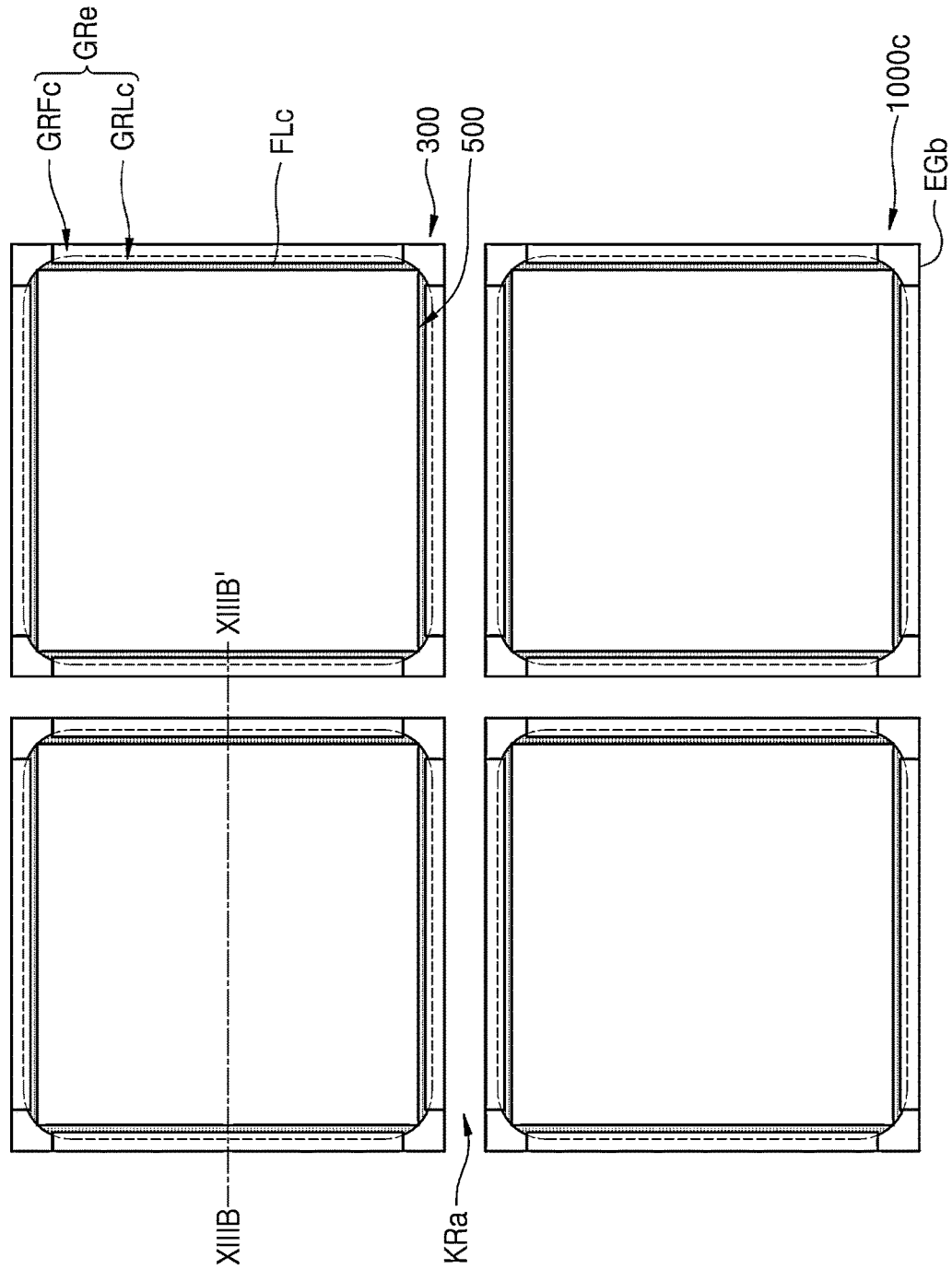
FIGS. 13A and 13B are a plan layout diagram and a cross-sectional view illustrating a method of manufacturing a semiconductor package according to some example embodiments and a semiconductor package manufactured by the method.
Figure 13B:
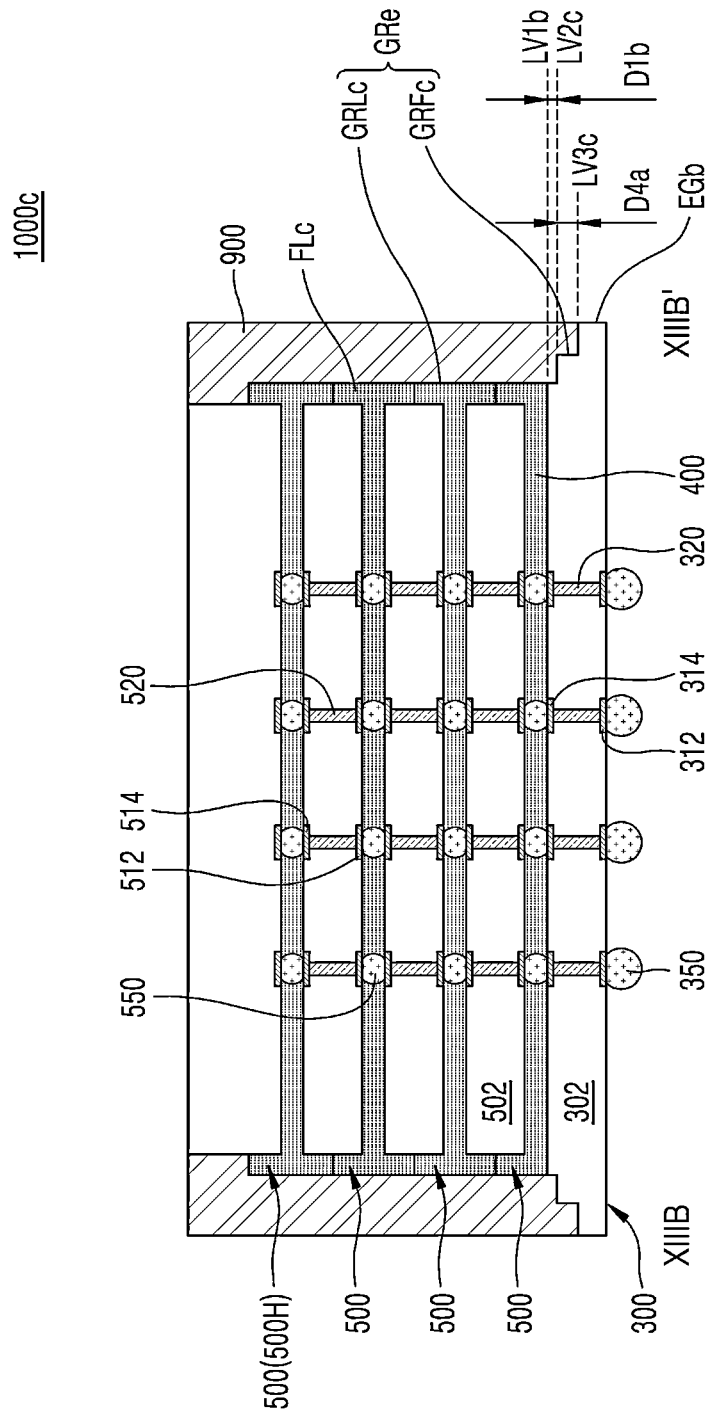

FIGS. 13A and 13B are a plan layout diagram and a cross-sectional view illustrating a method of manufacturing a semiconductor package 1000c according to some example embodiments and a semiconductor package 1000c manufactured by the method. Specifically, FIG. 13B is a cross-sectional view taken along the line XIIIB-XIIIB' of FIG. 13A.

Referring to FIGS. 13A and 13B, by performing a grooving process on the resultant material illustrated in FIGS. 10A and 10B, a grooving recess GRe including a first recess GRLc obtained by removing a part of the adhesive fillet FLb illustrated in FIGS. 10A and 10B and a second recess GRFc obtained by removing a part of the semiconductor substrate 30 adjacent to the first recess GRLc is formed. When the first recess GRLc is formed, the remaining portion of the adhesive fillet FLb illustrated in FIGS. 10A and 10B may reside as the adhesive fillet FLc. The adhesive fillet FLc does not have the residual fillet RFLb that the adhesive fillet FLb illustrated in FIGS. 11A and 11b has. The adhesive fillet FLc may be apart from the edge EGb of the first semiconductor chip 300.

Then, a molding layer 900 surrounding a plurality of second semiconductor chips 500 and an insulating adhesive layer 400 is formed on the semiconductor substrate 30. The molding layer 900 may fill the grooving recess GRe including the first recess GRLc and the second recess GRFc.

Then, by performing a dicing process of cutting off the molding layer 900 and the semiconductor substrate 30 along the grooving recess GRe, the plurality of semiconductor packages 1000c separate from one another with a kerf region KRa therebetween are formed. The semiconductor package 1000c includes the first semiconductor chip 300 and the plurality of second semiconductor chips 500 stacked on the first semiconductor chip 300.

The second recess GRFc may contact the edge EGb of the first semiconductor chip 300. The first recess GRLc may be apart from the edge EGb of the first semiconductor chip 300 with the second recess GRFc therebetween.

The uppermost surface of the first semiconductor chip 300 may be at a first vertical level LV1b and a lower surface of the first recess GRLc may be at a second vertical level LV2c that is lower than the first vertical level LV1b. The first recess GRLc may have a first depth D1b from the first vertical level LV1b at which the uppermost surface of the first semiconductor chip 300 is positioned. A lower surface of the second recess GRFc may be at a third vertical level LV3c lower than the first vertical level LV1b and the second vertical level LV2c and the second recess GRFc may have a fourth depth D4a from the uppermost surface of the first semiconductor chip 300.

Figure 14:
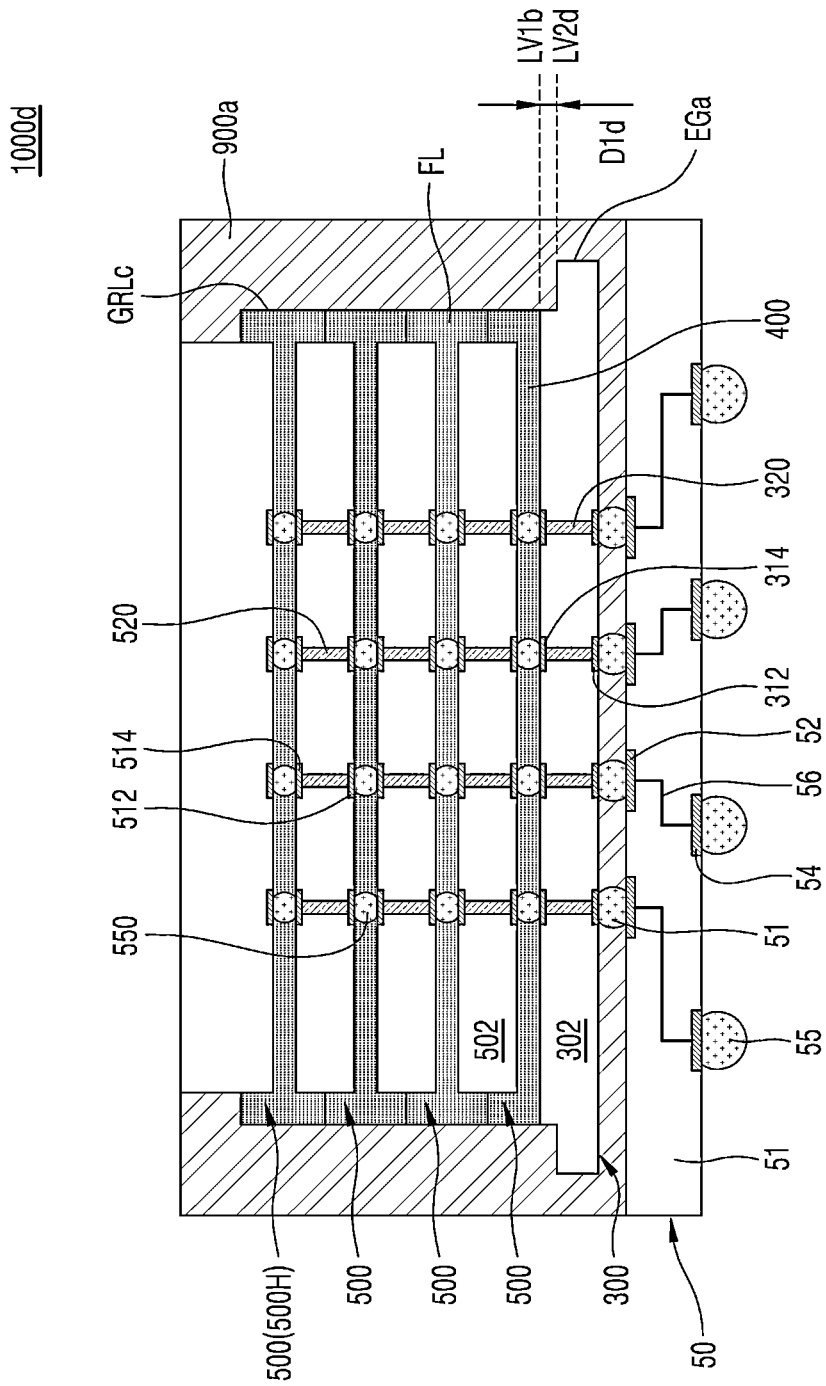
FIG. 14 is a cross-sectional view of a semiconductor package according to some example embodiments.

FIG. 14 is a cross-sectional view of a semiconductor package 1000d according to some example embodiments.

Referring to FIG. 14, the semiconductor package 1000d includes a package substrate 50, a first semiconductor chip 300 attached onto the package substrate 50, and a plurality of second semiconductor chips 500 stacked on the first semiconductor chip 300.

The package substrate 50 may include a base layer 51, a first upper pad 52 and a first lower pad 54 respectively arranged on an upper surface and a lower surface of the base layer 51, and a wiring path 53 electrically connecting the first upper pad 52 to the first lower pad 54 through the base layer 51.

In some example embodiments, the package substrate 50 may be an interposer. For example, the package substrate 50 may be a silicon interposer and/or a rewiring interposer. The base layer 51 may include a semiconductor, glass, ceramic, and/or plastic.

For example, in some example embodiments, the base layer 51 may include silicon. The wiring path 53 may be a wiring layer connected to the first upper pad 52 on the upper surface and/or the lower surface of the base layer 51 and/or an internal through electrode electrically connecting the first upper pad 52 to the first lower pad 54 in the base layer 51.

In some other example embodiments, the package substrate 50 may be printed circuit board (PCB). For example, the package substrate 50 may be a multilayer PCB. The base layer 51 may include at least one material selected from phenol resin, epoxy resin, and polyimide.

An insulating adhesive layer 400 may be between the first semiconductor chip 300 and each of the plurality of second semiconductor chips 500. The insulating adhesive layer 400 may have an adhesive fillet FLa protruding from a space between the first semiconductor chip 300 and each of the plurality of second semiconductor chips 500 outward. The adhesive fillet FLa may cover at least a part of a side surface of each of the plurality of second semiconductor chips 500.

The adhesive fillet FLa may be apart from an edge EGa of the first semiconductor chip 300.

A grooving recess GRc may extend along the edge EGa of the first semiconductor chip 300 adjacent to the adhesive fillet FLa. Because the grooving recess GRc is the same as the grooving recess GRc illustrated in FIGS. 9A to 9C, redundant description thereof is omitted.

The semiconductor package 1000a illustrated in FIGS. 9A to 9C is formed by a chip-on-wafer (CoW) method in which the first semiconductor chip 300 is formed by stacking the plurality of second semiconductor chips 500 on the semiconductor substrate 30 and then, separating the semiconductor substrate 30 as illustrated in FIGS. 6A to 6C. However, the semiconductor package 1000d illustrated in FIG. 14 is formed by a chip-on-chip (CoC) method in which the plurality of second semiconductor chips 500 are stacked on the first semiconductor chip 300.

For example, in the semiconductor package 1000d, after stacking the plurality of second semiconductor chips 500 on the first semiconductor chip 300, the grooving recess GRc is formed. Then, after attaching the resultant material having the grooving recess GRc and having the plurality of second semiconductor chips 500 stacked on the first semiconductor chip 300 to the package substrate 50, a molding layer 900a surrounding the first semiconductor chip 300, the plurality of second semiconductor chips 500, and the insulating adhesive layer 400 on the package substrate 50 is formed so that the semiconductor package 1000d is formed.

While the inventive concepts have been particularly shown and described with reference to some example embodiments thereof, it will be understood that various changes in form and details may be made therein without departing from the spirit and scope of the following claims.

What is claimed is:

1. A semiconductor package comprising:
a first semiconductor chip;
a plurality of second semiconductor chips sequentially stacked on the first semiconductor chip in a first direction; and
an insulating adhesive layer between the first semiconductor chip, the plurality of second semiconductor chips, and each of the plurality of second semiconductor chips, the insulating adhesive layer including an adhesive fillet protruding from between at least the first semiconductor chip and the plurality of second semiconductor chips,
wherein the first semiconductor chip, the plurality of second semiconductor chips, and the insulating adhesive layer are arranged as to define a grooving recess in the semiconductor package, the grooving recess including a first recess and a second recess adjacent to the first recess, the first recess and the second recess being arranged in a second direction substantially perpendicular to the first direction and substantially parallel to an edge of the first semiconductor chip, and
wherein a step portion between an uppermost surface of the adhesive fillet and the first semiconductor chip defines the first recess, and a step portion between an uppermost surface of the first semiconductor chip and a recessed surface inside the first semiconductor chip adjacent to the first recess defines the second recess.

2. The semiconductor package of claim 1, wherein the grooving recess is two-dimensionally bar-shaped or rectangular and extends along the edge of the first semiconductor chip.

3. The semiconductor package of claim 2, wherein
the grooving recess is included in a group of four grooving recesses extending along four edges of the first semiconductor chip, and
the four grooving recesses are spaced apart from one another.

4. The semiconductor package of claim 3, wherein
at least one of the four grooving recesses comprises the first recess and two of the second recesses,
the two second recesses are arranged on opposite sides of the first recess, and
the first recess extends along the edge of the first semiconductor chip.

5. The semiconductor package of claim 3, wherein at least one of the four grooving recesses comprise the first recess and the second recess sequentially arranged from the plurality of second semiconductor chips to the edge of the first semiconductor chip.

6. The semiconductor package of claim 1, wherein a lower surface of the second recess is at a vertical level lower than that of a lower surface of the first recess.

7. The semiconductor package of claim 6, wherein a lower surface of the first recess is at a vertical level higher than that of the uppermost surface of the first semiconductor chip.

8. The semiconductor package of claim 7, wherein the adhesive fillet comprises a residual fillet covering an upper surface of the first semiconductor chip on the lower surface of the first recess.

9. The semiconductor package of claim 6, wherein the lower surface of the second recess is at a vertical level lower than that of the uppermost surface of the first semiconductor chip.

10. The semiconductor package of claim 1,
wherein a horizontal width of the first semiconductor chip is greater than a horizontal width of each of the plurality of second semiconductor chips.

11. A semiconductor package comprising:
a first semiconductor chip;
a plurality of second semiconductor chips sequentially stacked on the first semiconductor chip in a first direction and each having a horizontal width less than that of the first semiconductor chip;
an insulating adhesive layer between the first semiconductor chip, the plurality of second semiconductor chips, and each of the plurality of second semiconductor chips, the insulating adhesive layer including an adhesive fillet protruding from between at least the first semiconductor chip and the plurality of second semiconductor chips and covering at least a part of a side surface of each of the plurality of second semiconductor chips and at least a part of an upper surface of the first semiconductor chip; and
a molding layer surrounding the plurality of second semiconductor chips and the insulating adhesive layer on the first semiconductor chip,
wherein the first semiconductor chip, the plurality of second semiconductor chips, and the insulating adhesive layer are arranged as to define a grooving recess contacting an edge of the first semiconductor chip, and extending along the edge of the first semiconductor chip, the grooving recess including a first recess and a second recess adjacent to the first recess, the first recess and the second recess being arranged in a second direction substantially perpendicular to the first direction and substantially parallel to the edge of the first semiconductor chip, and wherein a step portion between an uppermost surface of the adhesive fillet and the first semiconductor chip defines the first recess, and a step portion between an uppermost surface of the first semiconductor chip and a recessed surface inside the first semiconductor chip adjacent to the first recess defines the second recess.

12. The semiconductor package of claim 11, wherein the grooving recess extends along the edge of the first semiconductor chip with a constant horizontal width.

13. The semiconductor package of claim 11, wherein
the lower surface of the first recess is at a vertical level higher than that of the uppermost surface of the first semiconductor chip, and
the adhesive fillet comprises a residual fillet contacting the edge of the first semiconductor chip while covering the upper surface of the first semiconductor chip on the lower surface of the first recess.

14. The semiconductor package of claim 11, wherein
the first recess extends from the uppermost surface of the first semiconductor chip to the inside of the first semiconductor chip such that a lower surface of the first recess is at a vertical level lower than that of the uppermost surface of the first semiconductor chip, and
a lower surface of the second recess is at a vertical level lower than that of the lower surface of the first recess.

15. The semiconductor package of claim 11, wherein each of the first recess and the second recess contacts the edge of the first semiconductor chip.

16. The semiconductor package of claim 11, wherein
the second recess contacts the edge of the first semiconductor chip, and
the first recess is apart from the edge of the first semiconductor chip with the second recess therebetween.

17. The semiconductor package of claim 11, wherein the adhesive fillet is apart from the edge of the first semiconductor chip.

18. A semiconductor package comprising:
a first semiconductor chip including
a first substrate,
a first semiconductor device on the first substrate, and
a plurality of first through electrodes passing through at least a part of the first substrate;
at least one second semiconductor chip stacked on the first semiconductor chip in a first direction and having a horizontal width less than that of the first semiconductor chip, the at least one second semiconductor chip including
a second substrate,
a second semiconductor device on the second substrate, and
a plurality of second through electrodes passing through at least a part of the second substrate and electrically connected to the plurality of first through electrodes;
an insulating adhesive layer between the first semiconductor chip and the at least one second semiconductor chip, the insulating adhesive layer including an adhesive fillet protruding from between the first semiconductor chip and the at least one second semiconductor chip and covering at least a part of a side surface of the at least one second semiconductor chip and at least a part of an upper surface of the first semiconductor chip; and
a molding layer surrounding the at least one second semiconductor chip and the insulating adhesive layer on the first semiconductor chip,
wherein the first semiconductor chip, the plurality of second semiconductor chips, and the insulating adhesive layer are arranged as to define four grooving recesses extending along four edges of the first semiconductor chip with a constant horizontal width, and filled with the molding layer, each of the four grooving recesses including a first recess and a second recess adjacent to the first recess, the first recess and the second recess being arranged in a second direction substantially perpendicular to the first direction and substantially parallel to the edge of the first semiconductor chip,
wherein a step portion between an uppermost surface of the adhesive fillet and the first semiconductor chip defines the first recess, and a step portion between an uppermost surface of the first semiconductor chip and a recessed surface inside of the first semiconductor chip adjacent to the first recess defines the second recess, and
wherein the second recess has a lower surface at a vertical level lower than that of a lower surface of the first recess.

19. The semiconductor package of claim 18, wherein
each of the first recess and the second recess contacts an edge of the four edges of the first semiconductor chip, and
the adhesive fillet comprises a residual fillet contacting at least one of the four edges of the first semiconductor chip while covering the upper surface of the first semiconductor chip on the lower surface of the first recess.

20. The semiconductor package of claim 18, wherein
the constant horizontal width of each of the four grooving recesses is about 5 μm to about 50 μm, and
a depth of the second recess is about 1 μm to about 5 μm from the uppermost surface of the first semiconductor chip.

* * * * *